(12) United States Patent
Bando

(10) Patent No.: US 8,106,418 B2
(45) Date of Patent: Jan. 31, 2012

(54) LIGHT EMITTING DEVICE

(75) Inventor: Yoshitaka Bando, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/722,547

(22) Filed: Mar. 12, 2010

(65) Prior Publication Data

US 2010/0155771 A1    Jun. 24, 2010

Related U.S. Application Data

(63) Continuation of application No. 11/616,533, filed on Dec. 27, 2006, now Pat. No. 7,719,024.

(30) Foreign Application Priority Data

| May 10, 2006 | (JP) | 2006-131915 |
| Sep. 12, 2006 | (JP) | 2006-247359 |
| Oct. 6, 2006 | (JP) | 2006-274724 |

(51) Int. Cl.
*H01L 33/00* (2010.01)
(52) U.S. Cl. .......... 257/99; 257/100; 257/693; 257/695; 257/696; 257/E33.066; 257/E23.047; 257/E23.048
(58) Field of Classification Search .......... None
See application file for complete search history.

(56) References Cited

U.S. PATENT DOCUMENTS

| 6,054,716 | A | 4/2000 | Sonobe et al. | |
| 6,603,148 | B1 * | 8/2003 | Sano et al. | 257/98 |
| 2002/0163001 | A1 * | 11/2002 | Shaddock | 257/79 |
| 2002/0185649 | A1 | 12/2002 | Oshio | |
| 2006/0043401 | A1 * | 3/2006 | Lee et al. | 257/99 |
| 2007/0252246 | A1 | 11/2007 | Ng et al. | |

FOREIGN PATENT DOCUMENTS

| JP | 2004-214338 | 7/2004 |
| JP | 2005-33194 | 2/2005 |

OTHER PUBLICATIONS www.nichia.co.jp/jp.product/led-smd.powerled.html, Nichia Products, SMD Type LED, Power LED Series, accessed May 8, 2006.
"LED catalogue," NICHIA, Apr. 2006.

* cited by examiner

*Primary Examiner* — Minh-Loan T Tran
*Assistant Examiner* — Leslie Pilar Cruz
(74) *Attorney, Agent, or Firm* — Ditthavong Mori & Steiner, P.C.

(57) ABSTRACT

A light emitting device includes a first lead and a second lead. The first lead has a top surface which a light emitting element is mounted thereon and a bottom surface opposed to the top surface. The second lead has a lead peripheral region where a wire connected to an electrode of the light emitting element is bonded therewith. The first lead includes a lead middle region where the semiconductor light emitting element is mounted thereon to thermally conduct therewith. A bottom surface of the lead middle region is exposed from a package. The second lead has an outer lead region that is projected outwardly from the both side surfaces of the package. The bottom surface of the first lead middle region is substantially coplanar with a bottom surface of the outer lead region.

3 Claims, 18 Drawing Sheets

101 · · LEAD MIDDLE REGION
102 · · LEAD PERIPHERAL REGION
103 · · LEAD BENT REGION

LEAD CONNECTION PORTION    LEAD RUNNER

LIGHT EMITTING DEVICE

CROSS-REFERENCE TO RELATED APPLICATIONS

The present application is a continuation application of U.S. patent application Ser. No. 11/616,533, filed Dec. 27, 2006, which claims priority to Japanese Patent Application No. 2006-131915 filed on May 10, 2006, No. 2006-247359 filed on Sep. 12, 2006, and No. 2006-274724 filed on Oct. 6, 2006. The contents of these applications are incorporated herein by reference in their entirety.

BACKGROUND OF THE INVENTION

1. Field of the Invention

The present invention relates to a light emitting device.

2. Description of the Related Art

FIG. 17 is a perspective view showing one production process of a conventional LED light emitting device 200. FIG. 18 is a cross-sectional view showing the LED light emitting device 200. The LED light emitting device 200 includes a package 206 and a lead 205, as shown in FIG. 8. The package 206 includes space that opens upward and has a substantially inverted truncated cone shape. The lead 205 is made of a conductive material and is fixedly attached to the package 206. The lead 205 includes a lead middle portion 205b that is located in a substantially middle part of the light emitting device, and a lead terminal portion 205a that projects outward of the package 206. When the lead 205 and the package 206 are fixedly attached, the lead middle portion 205b that is a part of the lead 205 is exposed in the space in the packaged 206 that has a substantially inverted truncated cone shape. An LED chip 203 is mounted on the exposed lead middle portion 205b in the space of the package 206. In addition, the lead middle portion 205b penetrates and extends inside the package 206 as shown by a dashed line. The lead then projects from a substantially center on the side surface of the package 206 in the thickness direction. The thus-projecting lead 205 is bent at substantially right angle so as to extend along the side surface of the package, and is again bent at substantially right angle so as to turn a corner toward the bottom of the package 206 as shown in FIG. 18. A lead region that extends outside the package 206, in other words, a lead region that is bent so as to extend along the side and bottom surfaces of the package 206 is referred to as the lead terminal portion 205a. Note that FIG. 17 is the perspective view showing the LED light emitting device 200 prior to bending the lead terminal portion 205a. Additionally, sealing resin 202 is filled in the space that opens in the package 206.

In conventional production of the light emitting device 200, a plurality of patterns for light emitting devices are formed in a lead frame 110 made of a sheet of conductive material as shown in FIG. 4. Subsequently, the lead frame is subjected to production processes. The lead frame is cut and separated into individual patterns in a certain process. Thus, a plurality of light emitting devices are produced at a time. FIG. 17 shows the individual light emitting device 200 that is separated by cutting proper locations in the lead 205 that connects LED light emitting devices after the aforementioned production processes.

As shown in FIG. 18, the LED chip 203 is mounted on the lead middle portion 205b, and they are electrically conducted to each other. In addition, the lead terminal portion 205a that is bent toward the bottom surface side of the light emitting device 200 is installed on a mount body 201 with conductive patterns by solder or the like. This installation provides electrically connection between the LED chip 203 and the mount body 201 through the lead terminal portion 205a. However, in this construction, there are problems that require a process for bending the lead terminal portion so as to adjust its alignment along the side and bottom surfaces of the semiconductor light emitting device, reduce resistance of lead terminal portion due to the bent lead terminal portion, and make the LED light emitting device thick since the lead terminal portion is bent so as to extend the side and bottom surfaces thereof.

Furthermore, the lead terminal portion 205a requires a length enough to be bent to some extent. In addition, since the lead 205 is made of a conductive material such as copper and iron, silver or the like is plated to prevent oxidation. The thus-plated lead 205 has good wettability, and can be stably bonded to the mount body 201 with solder or the like. Generally, the lead frame 110 is plated as shown in FIG. 4. The patterns on the plated lead frame 110 are subjected to LED light emitting device processing. In other words, in a process after plating, proper locations of the leads 205 that connect the LED light emitting devices are cut, as a result, the connected LED light emitting devices are separated into individuals. Accordingly, a cut surface 205c that is produced by cutting the lead 205 is not plated. For this reason, this cut surface is prone to be oxidized to rust. Additionally, since the oxidized cut surface 205c has poor wettability, solder or the like crawls. As a result, there is a problem that causes insufficient adhesiveness between the oxidized cut surface 205c and the mount body 201. Additionally, in mass-production processes of a number of LED light emitting devices, the sharp cut surface 205c of the lead terminal portion that projects from the end surface of one LED light emitting device may damage other semiconductor light emitting devices. On the other hand, since the lead terminal portion 205a is long, the lead terminal portion may be bent at an undesired angle due to some shock, or may be cut off. Additionally, long lead terminal portions reduce the number of leads that are arranged in patterns in one sheet of lead frame, and thus cause poor efficiency and comparatively high cost.

Furthermore, as shown in FIG. 18, in the case where the lead terminal portion 205a that contacts the bottom surface of the LED light emitting device 200 and the mount body 201 are fixedly attached with solder or the like, a surface layer of the lead terminal portion 205a serves as a bonding surface. Accordingly, in order to stably fix them, as shown in FIG. 17, the lead terminal portion 205a should have a width W to some extent. In addition, if the lead terminal portion 205a is not bent so as to extend along the bottom surface of the package 206, the bottom surface of the package 206 and the top surface of the mount body 201 are not bonded in parallel. In this case, the LED light emitting device may be fixedly attached at an incline. As a result, there is a problem that the reach of light emitted from the LED light emitting device 200 is deviated.

In order to prevent this deviation of the reach, as shown in FIG. 18, a projection portion 206a is disposed on the bottom surface of the package 206, so that the bottom surface of this projection portion 206a and the mount body 201 are in stable contact with each other. Accordingly, it is necessary to accommodate the lead terminal portion 205a in a height h of the projection portion 206a on the bottom surface of the package. However, depending on the length, bent angle or bent location of lead terminal portion 205a, the lead terminal portion 205a pushes the package 206 upward. Thus, a gap may be produced between the package 206 and the mount body 201. As a result, the installation angle or installation location of the LED light emitting device 200 can be deviated. In addition, the lead terminal portion 205a may not completely align along the bottom surface of the package 206, as a result, there is a problem that the LED light emitting device 200 and the mount body 201 are not stably and mechanically or electrically coupled to each other. Additionally, since the lead terminal portion has a relatively large width W, the width of the cut surface 205c correspondingly becomes wider. This increases the defect due to the aforementioned cut surface of the lead terminal portion.

Moreover, FIG. 19 is a perspective view showing another LED light emitting device 300. FIG. 20 is a side view of the LED light emitting device 300 shown in FIG. 19. The lead terminal portions of the LED light emitting device 300 shown in FIG. 19 have a length shorter than the lead terminal portion 205a of the LED light emitting device shown in FIGS. 17 and 18, and additionally are not bent. In addition, the lead terminal portions 305a of the LED light emitting 300 horizontally project outward of a package 306 from the bottom surface of the package 306 as shown in FIGS. 19 and 20. Accordingly, in the case where the LED light emitting device 300 contacts the mount body 301, the lead terminal portion 305a contacts the mount body 301. In this case, they can be fixed by solder or the like. As a result, it is not necessary to bend the lead terminal portion 305a so as to turn a corner toward the bottom surface side of the package 306, in order to provide a contact region with the mount body 301.

However, a projection portion is formed in a substantially rectangular projection on the end surface of the lead terminal portion 305a, and has a cut surface that is produced when the lead terminal portion 305a is cut off from a lead frame. Since this projection portion has edged corners, these parts may damage other light emitting devices 300. On the other hand, the defect that the cut surface is oxidized in air is not still solved. See Japanese Patent Laid-Open Publication TOKU-KAI No. 2005-33194.

SUMMARY OF THE INVENTION

According to one aspect of the present invention, a light emitting device includes a semiconductor light emitting element having an electrode, a lead including a first lead and a second lead, a package forming a recessed opening so as the top surface of the lead to be partially exposed in the bottom of the opening, and a sealing resin that seals the opening of the package. The first lead has a top surface which the light emitting element is mounted thereon and a bottom surface opposed to the top surface. The second lead has a lead peripheral region where a wire connected to the electrode of the light emitting element is bonded therewith. The first lead includes a lead middle region where the semiconductor light emitting element is mounted thereon to thermally conduct therewith. A bottom surface of the lead middle region is exposed from the package. The second lead has an outer lead region that is projected outwardly from the both side surfaces of the package. The bottom surface of the first lead middle region is substantially coplanar with a bottom surface of the outer lead region.

BRIEF DESCRIPTION OF THE DRAWINGS

FIG. 12 shows perspective views of a lens-attached semiconductor light emitting device according to a second embodiment, wherein FIG. 12(a) is a perspective view as viewed from the top side, and FIG. 12(b) is a perspective view as viewed from the bottom side;

FIG. 13 shows perspective views of a lens-attached semiconductor light emitting device according to a third embodiment, wherein FIG. 13(a) is a perspective view as viewed from the top side, and FIG. 13(b) is a perspective view as viewed from the bottom side;

FIG. 14 shows perspective views of the lens-attached semiconductor light emitting device according to a fourth embodiment, wherein FIG. 14(a) is a perspective view as viewed from the top side, and FIG. 14(b) is a perspective view as viewed from the bottom side;

FIG. 15 shows perspective views of the lens-attached semiconductor light emitting device according to a fifth embodiment, wherein FIG. 15(a) is a perspective view as viewed from the top side, and FIG. 15(b) is a perspective view as viewed from the bottom side;

FIG. 16 shows perspective views of a semiconductor light emitting device according to a sixth embodiment, wherein FIG. 16(a) is a perspective view as viewed from the top side, and FIG. 16(b) is a perspective view as viewed from the bottom side;

DETAILED DESCRIPTION OF THE PREFERRED EMBODIMENT

In this specification, a light emitting element is not limited to the designation, and refers to an element including a photoreceptor such as photodiode and CCD, and an optical element such as image pickup element.

First Embodiment

Figure 1:
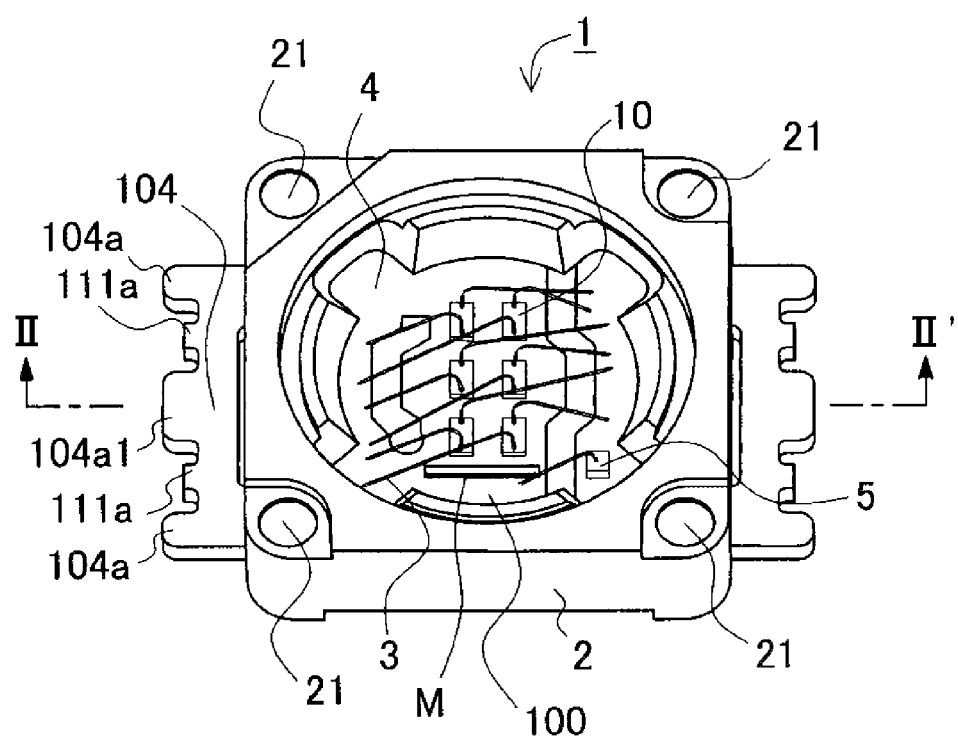
FIG. 1 is a perspective view showing a semiconductor light emitting device according to a first embodiment.
Figure 2:
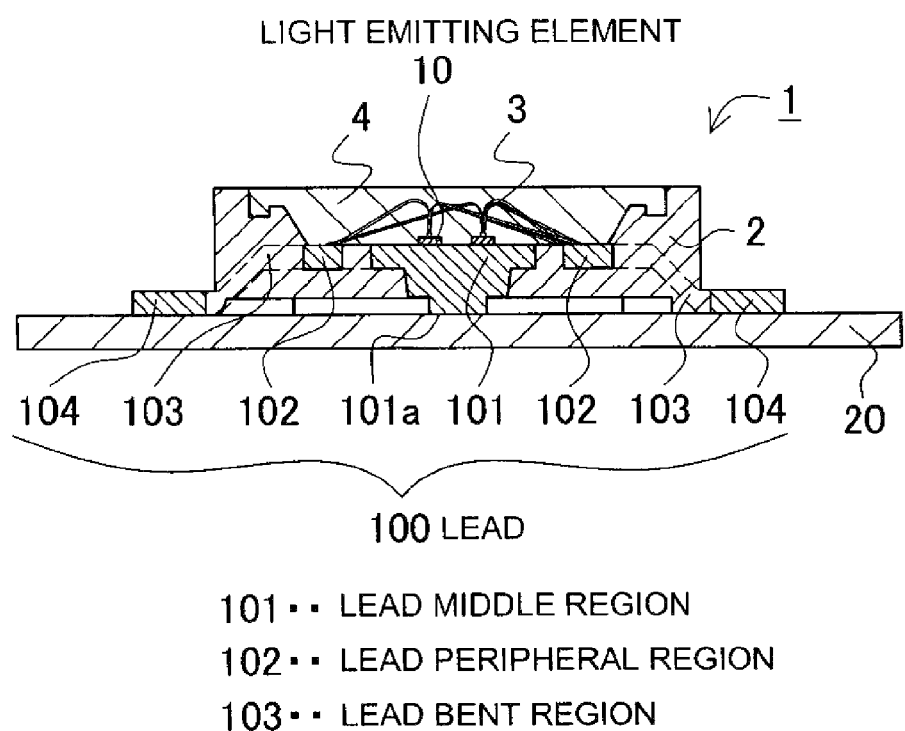
FIG. 2 is a cross-sectional view showing a sate where the semiconductor light emitting device according to the first embodiment is secured on a mount body.

FIG. 1 is a perspective view showing a semiconductor light emitting device 1 according to a first embodiment. FIG. 2 is a cross-sectional view of the semiconductor light emitting device 1 of FIG. 1 taken along the line II-II'. The semiconductor light emitting device 1 according to the first embodiment is now schematically described with reference to FIGS. 1 and 2. The semiconductor light emitting device 1 is provided with a package 2 that is mounted on lead arrangement 100. The package 2 has space that is formed in a substantially recessed shape and opens upward. In addition, a plurality of light emitting elements 10 are mounted on an exposed part of the lead arrangement 100 inside the space of the package 2. That is, the package 2 serves as a frame body that surrounds the light emitting elements 10. Additionally, a protection element 5 such as Zener diode 5 is also mounted inside the opening space of the package 2. The protection element 5 provides electrical conduction when a voltage higher than a regulation voltage is applied. On the other hand, the light emitting elements 10 are electrically connected to the lead arrangement through gold wire lines 3, bumps or the like. Besides, the opening space of the package 2 is filled with a sealing resin 4.

Description will be made for each member.

Light Emitting Element 10

FIGS. 3(a) and 3(b) are views schematically showing the light emitting element 10. FIG. 3(a) is a plan view showing the light emitting element 10. FIG. 3(b) is a cross-sectional view showing the light emitting element 10 shown in FIG. 3(a) taken along the line III-III'. A semiconductor light emitting element is suitably used as the light emitting element 10. This type of semiconductor light emitting element has a semiconductor layer 12 that is epitaxially grown on a growth substrate 11. A sapphire substrate can be given as an example of the growth substrate 11. However, the growth substrate 11 is not limited to sapphire, but known members, such as spinel, SiC, GaN, and GaAs can be used. In addition, in the case where not an insulating substrate such as sapphire but a conductive substrate such as SiC, GaN, and GaAs is used, a p-electrode and an n-electrode can be opposed to each other.

The light emitting element 10 can include various materials, such as BN, SiC, ZnSe, GaN, InGaN, InAlGaN, AlGaN, BAlGaN, and BInAlGaN. Si, Zn, and so on, can be included in these elements as impurity elements and serve as the center of light emission. A nitride semiconductor (e.g., $In_xAl_yGa_{1-x-y}N$, where $0 \leq x$, $0 \leq y$, $x+y \leq 1$ as a nitride semiconductor containing Al and Ga, or a nitride semiconductor containing In and Ga) and so on can be used as a material of a light emission layer. In addition, MIS junction, PIN junction, homo structure with pn junction, hetero structure, double-hetero structure, or the like, can be suitably used as the structure of the semiconductor layer. Additionally, various light-emission wavelengths can be selected depending on materials and mixed crystal ratios of semiconductor layer. Additionally, the semiconductor layer can have a single- or multi-quantum-well structure provided with thin layer(s) for quantum effect. In this case, it is possible to improve output power. The light emitting elements 10 can emit light from the ultraviolet range to the visible range. In particular, it is preferable that the light emitting elements having a light emission peak wavelength in the proximity of the range between 350 nm and 550 nm are used. The light emitting elements preferably include light emission layers that can emit light with a light emission wavelength capable of exciting a phosphor material. This description will be made as exemplary light emitting elements 10 of nitride semiconductor light emitting elements. However, the light emitting elements 10 are not limited to nitride semiconductor light emitting elements.

The nitride semiconductor light emitting element 10 according to the first embodiment includes the semiconductor layer 12 that has an n-type layer 14, an active layer 18 and a p-type layer 16. The n-type layer 14, the active layer 18 and the p-type layer 16 are formed of a nitride semiconductor, and are laminated in this order on the sapphire substrate 11, as shown in FIG. 3(b). An n-pad electrode 15 is formed on an exposed portion of the n-type semiconductor On the other hand, a p-pad electrode 17 is formed on a p-ohmic electrode (not shown). The n-pad electrode 15 and the p-pad electrode 17 are spaced away from each other on the line.

Lead Arrangement 100

Figure 4:
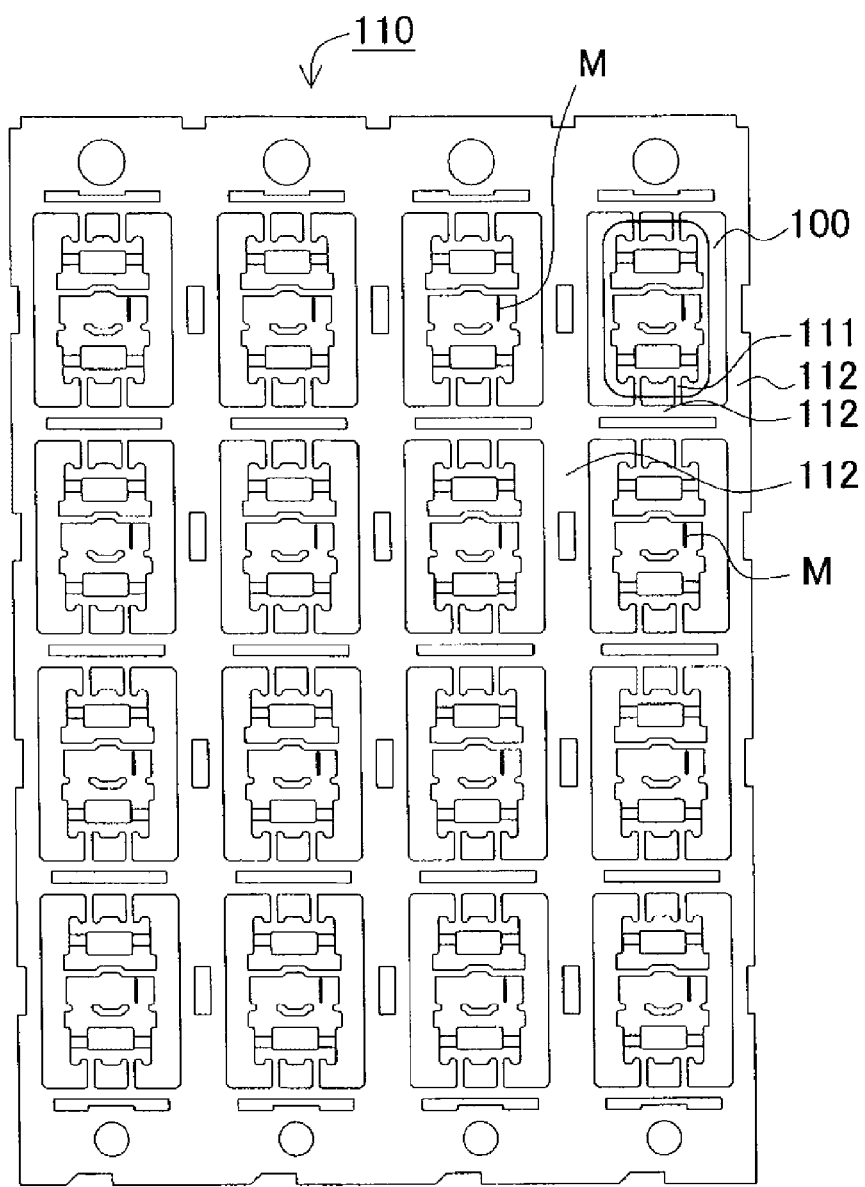
FIG. 4 is a plan view showing a lead frame.

FIG. 4 is a plan view showing one production process of the semiconductor light emitting device 1 according to the first embodiment. A plurality of patterns of lead arrangement 100 are arranged in a matrix shape on the lead frame 110 made of a conductive material. That is, the lead frame 110 is processed (e.g., stamped) so that the patterns of lead arrangement 100 are connected as branches to frame-shaped lead runners 112 through lead connection portions 111. The plurality of patterns of the lead arrangement 100 are processed at a time, and thus are formed into the semiconductor light emitting devices 1 through production processes described later. In a certain process, the plurality of patterns of the lead arrangement 100 are separated into individual semiconductor light emitting devices 1 by cutting the lead connection portions 111.

FIG. 5(a) is an enlarged perspective view of one of the patterns of lead arrangement 100 that are arranged in a matrix shape on the lead frame 110 of FIG. 4. FIG. 5(b) is a cross-sectional view of the lead arrangement 100 of FIG. 5(a) taken along the line V-V'.

Figure 5:
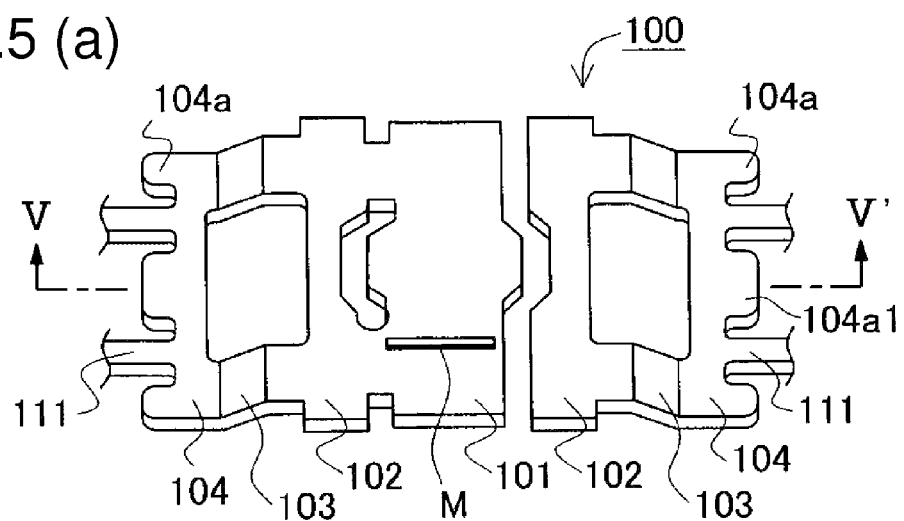
FIG. 5(a) is a perspective view showing one process in the production method of the semiconductor light emitting device according to the first embodiment.
FIG. 5(b) is a cross-sectional view showing the process shown in FIG. 5(a) taken along the line V-V'.
Figure 5:
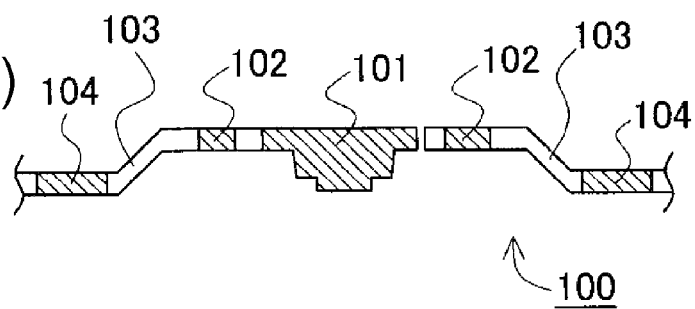

In the present invention, the lead arrangement 100 includes not only parts that are exposed outside the frame body but also parts that are located inside the frame body of the semiconductor light emitting device 1, and serves as a core member. As shown in FIGS. 5(a) and 5(b), the lead arrangement 100 includes a lead middle region 101 that is located in a substantially middle part and is provided with the semiconductor light emitting elements 10 mounted thereon, lead peripheral regions 102 that are electrically connected to the light emitting elements 10, lead bent regions 103 that are subjected to bending, and outer lead regions 104. In addition, ends of the outer lead regions 104 include substantially rectangular projections that extend from the same plane as the outer lead regions 104. These projections are referred to as outer lead projections 104a. In an example of FIG. 5, three outer lead projections 104a are located in each of the right and left side outer lead regions 104. That is, the three outer lead projections 104a includes edge-side outer lead projections 104a that are located on both edges of the outer lead region 104, and a middle outer lead projections 104a1 that is located in the middle part and has a wider width. On the other hand, the outer lead region 104 is provided with the lead connection portions 111. The patterns of lead arrangement 100 are connected to adjacent lead runners 112 through the lead connection portions 111 (FIG. 4). Note that the lead middle region 101, the lead peripheral regions 102, the lead bent regions 103, the outer lead regions 104, the outer lead projections 104a, and the lead connection portions 111 are named for parts of the lead arrangement for sake of explanation, and in this embodiment all of them are unitarily formed of the same material. However, the positive and negative terminals in electrical connection regions of the lead arrangement will be electrically disconnected from each other.

The lead arrangement 100 has a top surface side (the upper surface side in FIG. 5(b)) where the light emitting elements 10 are mounted, and a bottom surface side (the lower surface side in FIG. 5(b)) opposed to the top surface side. The top surface of the lead middle region 101 is substantially coplanar with the top surfaces of the lead peripheral regions 102. The lead bent regions 103 are bent at an incline toward the bottom surface side. Thus, the outer lead regions 104 are stepped down but in parallel to the top surface of the lead middle region 101 and the top surfaces of the lead peripheral regions 102. That is, as shown in FIG. 5(b), the top surfaces of the lead middle region 101 and the lead peripheral regions 102, the top surfaces of the lead bent regions 103, and the top surfaces of the outer lead regions 104 become lower in this order. In other words, the lead bent regions 103 serve to adjust the bottom surfaces of the outer lead regions 104 so as to be coplanar with the bottom surface of the lead middle region 101. Thus, the lead bent regions 103 are bent at an incline. The bent angle of the lead bent regions 103 is adjusted by the level difference between the outer lead region 104 and the lead peripheral region 102. The lead bent regions 103 can be formed by press work. The lead bent regions 103 are located inside the package 2 described later.

The light emitting elements 10 are mounted on and electrically connected to the bent lead arrangement 100 in a later process. However, the positive and negative terminals in electrical connection regions of the lead arrangement will be separated and isolated from each other, and thus are electrically disconnected to each other. In addition, the positive and negative terminals can be electrically connected to external terminals. The lead arrangement 100 can be formed of a material with good electrical conductivity such as copper, phosphor bronze, iron and nickel. In the first embodiment, copper is employed. In addition, it is preferable that only connection parts between the light emitting elements 10 and an external terminal are exposed on the lead arrangement 100, and in order to prevent corrosion of metal, after bending, a noble metal such as silver, gold, palladium and rhodium is plated on the other parts of the lead arrangement. Note that parts other than the connection parts may be exposed to improve light reflectivity.

Package 2

Figure 6:
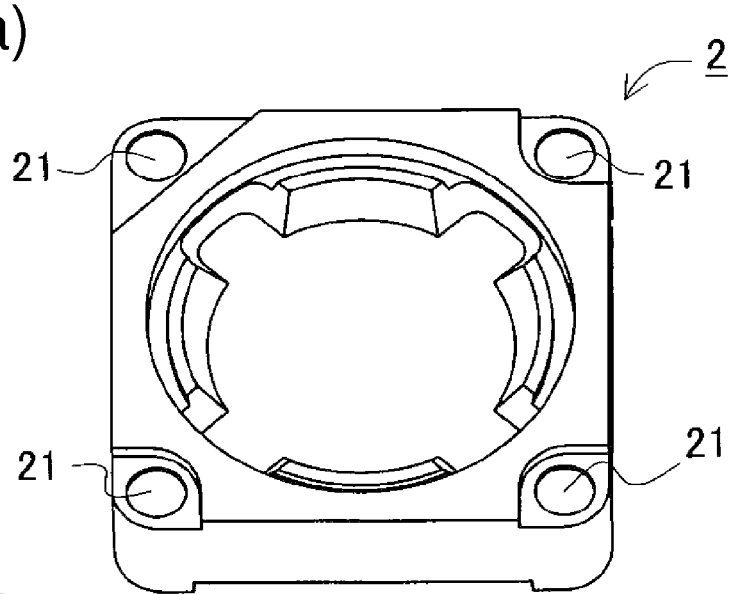
FIG. 6(a) is a perspective view showing one process in the production method of the semiconductor light emitting device according to the first embodiment.
FIG. 6(b) is a perspective view of another process.
FIG. 6(c) is a cross-sectional view showing the process shown in FIG. 6(b) taken along the line VI-VI'.
Figure 6:
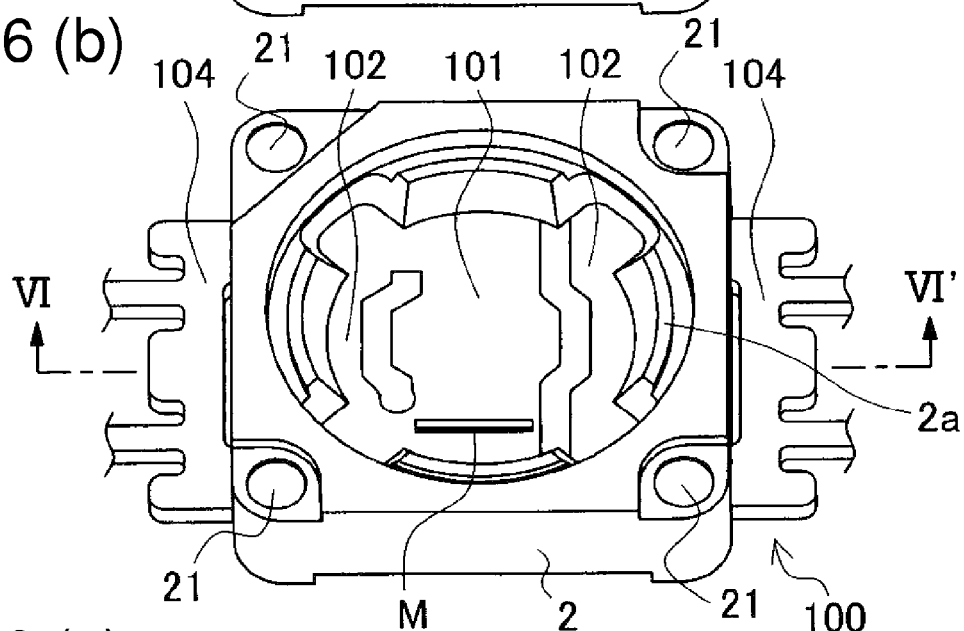
Figure 6:
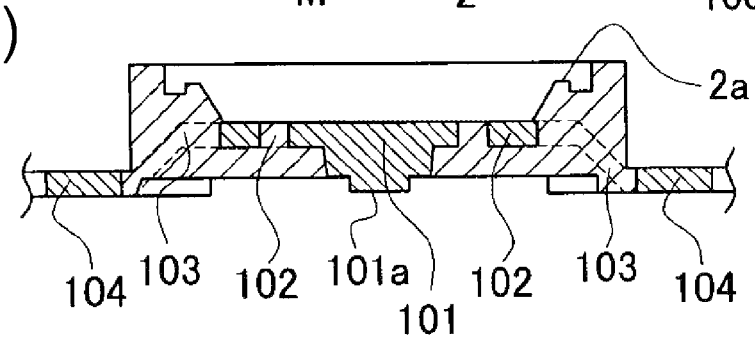

FIG. 6(a) is a perspective view showing the package 2. FIG. 6(b) is a perspective view showing a state where the package 2 is secured to the lead arrangement 100. FIG. 6(c) is a cross-sectional view of the package 2 secured to the lead arrangement 100 taken along the line VI-VI' of FIG. 6(b). As shown in FIG. 6(a), the package 2 has the space and forms a frame body. The space opens upward and has a substantially inverted truncated cone shape. In order to mount the light emitting element 10 in a substantially middle part of this opening, the opening of the package 2 has a size larger than the light emitting element 10. In addition, the size of the space is determined in terms of reflection angle when light from the light emitting elements 10 strikes the side of the space of the package 2, light chromaticity distribution, later-described sealing resin that seals the opening, content and type of phosphor that is contained in the sealing resin, and so on. Accordingly, the space is not limited to a particular shape. Additionally, since the light emitting elements 10 are mounted in a substantially middle part of this opening, depending on the size of this opening, the distance between the light emitting element 10 and the side surface of the space of the package 2 is determined. In the case where the distance between the light emitting element 10 and the side surface of the space of the package 2 is uniform, it is possible to prevent color unevenness. The reason is that, in this case, the distance of the sealing resin that fills this opening between the light emitting element 10 and the side surface is also uniform. Accordingly, this arrangement is suitable.

As package 2, a high light resistant and transparent organic material such as silicone resin, epoxy resin, acrylic resin, urea resin, fluorocarbon resin and imide resin, and a high light resistant inorganic material such as glass and silica gel can be used. In addition, a thermosetting resin is used in order not to melt due to heat in production processes. Additionally, in order to relieve thermal stress of resin, various types of fillers such as aluminum nitride, aluminum oxide and mixture compound of them may be mixed. The package 2 is not limited to resin. A metal group material or a ceramic group material may be used as a part of package such as the interior side surface of the package 2, or as the whole of package. In this case, it is possible to avoid deterioration of the package 2 due to light radiation by light emitting elements.

The package 2 is formed by casting. Specifically, a cavity of heating mold is filled with liquid intermediate resin, and the bent lead arrangement 100 is disposed at a predetermined position in the cavity at substantially the same time. Thus, as shown in FIGS. 6(b) and 6(c), the resin is formed in a predetermined shape and is fitted in projections and depressions in the bent lead arrangement 100. Subsequently, the resin is cured by reaction such as heat reaction. Alternatively, the package 2 can be formed by transfer molding. The transfer molding is a thermosetting resin formation process that, after softening a thermosetting material such as non-flame-retarded resin in a heating pot, fills a cavity of heating mold with the thermosetting material and then cures the thermosetting material. As formation process of the package 2, injection molding, extrusion, press work, and so on can be given as other examples. In terms of resin, characteristics of the frame fitted therein, formation shape and so on, the formation process can be determined. Besides, the package 2 may be independently formed, and then attached to the lead arrangement 100.

To remove the formed package 2 from the cavity, the mold is opened, then the cured package 2 is ejected by an injector pin. Thus, the package 2 is removed from the mold. As shown in FIGS. 6(a) and 6(b), injector pin prints are formed at four corners of the removed package 2.

After the lead arrangement 100 is partially bent and is plated, the thus-formed package 2 is fixed so as to fill depressed space in the lead arrangement 100. As shown in FIG. 6(c), the outer lead regions 104 that are coupled to the lead bent regions 103 thus extend outward from opposed sides of the package 2 in parallel to the top surface of the lead middle region 101. In addition, the bottom surfaces of the outer lead regions 104 are substantially coplanar with the bottom surface of the lead middle region 101. Additionally, the lead bent regions 103 are embedded inside the package 2. The level difference that is produced by the bent parts of the lead bent region 103 provides good engagement between the lead arrangement 100 and the package 2, and thus increases adhesive strength.

As shown in FIGS. 6(b) and 6(c), the side surface that defines the substantially inverted truncated cone shaped space inside the package 2 has a slant and a circular shape, and is provided with a projecting rib 2a that is formed on the upper part of the slant. The rib 2a increases adhesive strength between the sealing resin 4 and the package 2, and provides an effect that prevents detachment of the sealing resin 4 from the package 2. The opening of the package 2 is filled with the sealing resin 4 in a later process.

The lead middle region 101 and the lead peripheral regions 102 are located in the frame body of the package 2. The top surfaces of them are exposed in the opening of the package 2. The lead middle region 101 is provided with the light emitting elements 10 that are mounted thereon. The lead peripheral regions 102 are electrically connected to the light emitting elements 10. In addition, as shown in FIG. 6(c), the package 2 is formed so that the lead middle region 101 penetrates the package 2 in the top-and-bottom direction (in the top-and-bottom direction in FIG. 6(c)). Thus, the bottom surface 101a of the lead middle region 101 is exposed outward. The exposed bottom surface 101a of the lead middle region 101 is located at one level lower than the bottom surface of the package 2. Accordingly, when the bottom of the semiconductor light emitting device 1 is bonded on a separate conductive mount body (not shown), the exposed bottom surface 101a of the lead middle region 101 comes in flat contact with the mount body. As a result, heat generated by the light emitting elements 10 can be dissipated externally of the semiconductor light emitting device 1 through the lead arrangement 100 that has excellent thermal conductivity. Therefore, heat dissipation effect is improved. In order to further improve heat dissipation effect, it is preferable that the bottom surface 101a of the lead middle region is installed on the mount body by solder or the like.

Light Emitting Element 10

FIG. 7(a) is a perspective view showing the semiconductor light emitting device 1 with the electrically conducted light emitting elements 10 are mounted on the lead middle region 101. FIG. 7(b) is a cross-sectional view of the semiconductor light emitting device 1 of FIG. 7(a) taken along the line VII-VII'. As shown in FIG. 7(a), die-bonding resin such as epoxy resin, and bumps such as silver paste are applied in predetermined, exposed locations of the lead middle region 101 inside the inverted substantially inverted truncated cone shaped space of the package 2. In addition, the light emitting elements 10 are bonded and mounted on the lead middle regions 101 in an electrical connected state. In the first embodiment, two light emitting elements 10 for each of three colors, total six elements are arranged in a matrix shape. However, color types, number, combination and arrangement can be arbitrarily selected. In this mounting process, as shown in FIG. 7(b), the bottom surfaces of the light emitting elements 10 are preferably disposed in parallel to the top surface of the lead middle region 101. The reason is to keep the light chromaticity distribution of the semiconductor light emitting device 1 in a predetermined state. On the other hand, a conductive material softer than the lead arrangement 100, such as silver paste and Ag—Sn, can be given as a material of the bumps. Additionally, a bonding material such as AuSi, SnAgBi, SnAgCu, SnAgBiCu, SnCu, SnBi, PbSn, In and so on, and combination of them can also be used. A eutectic material is selected in accordance with wettability and bonding characteristics depending on materials to be bonded.

Figure 3:
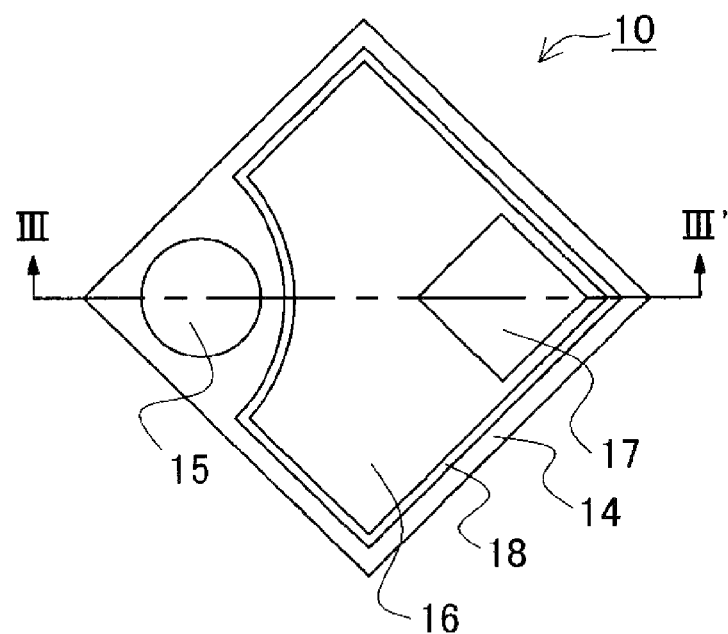
FIG. 3(a) is a plan view showing a production method of a light emitting element according to the first embodiment.
FIG. 3(b) is a cross-sectional view showing the light emitting element shown in FIG. 3(a) taken along the line III-III'.
Figure 3:
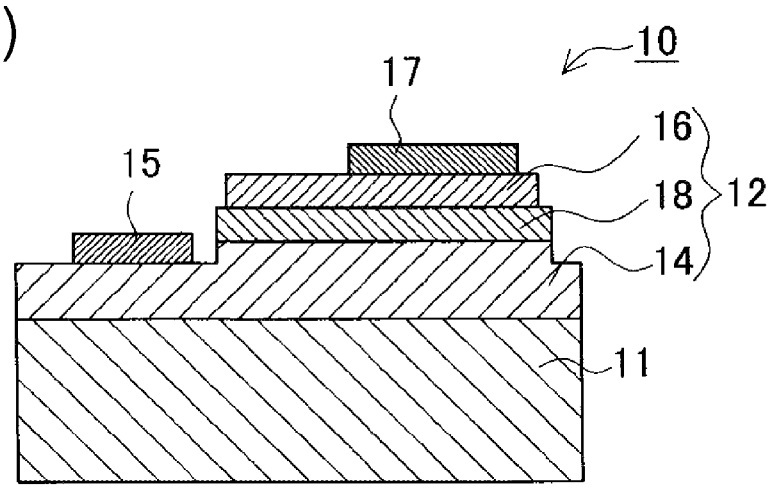
Figure 7:
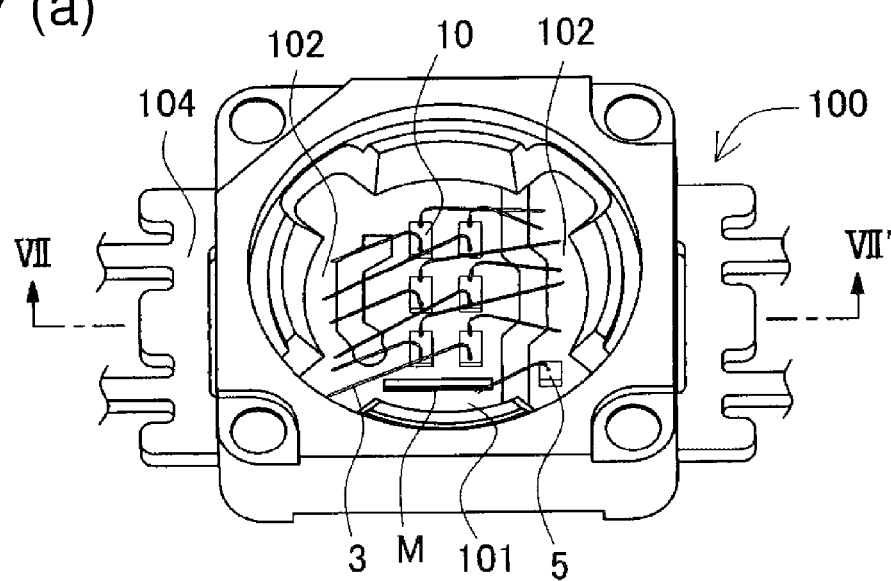
FIG. 7(a) is a perspective view showing one process in the production method of the semiconductor light emitting device according to the first embodiment.
FIG. 7(b) is a cross-sectional view showing the process shown in FIG. 7(a) taken along the line VII-VII'.
Figure 7:
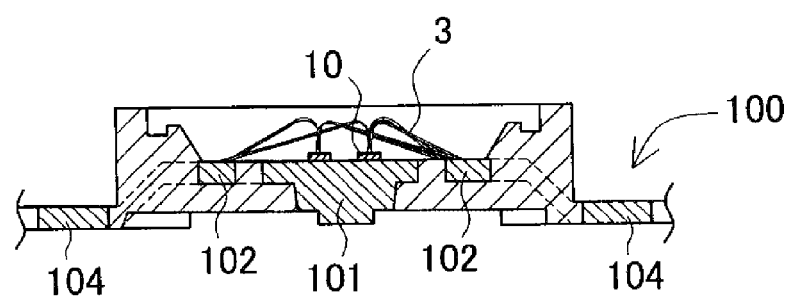

As shown in FIGS. 7(a) and 7(b), the lead peripheral regions 102 are disposed beside both sides of the lead middle region 101 on which the light emitting elements 10 are mounted. The n-pad and p-pad electrodes of the light emitting elements 10 shown in FIG. 3 are electrically connected to these lead peripheral regions 102. The pad electrodes and the lead peripheral regions 102 are connected by wire-bonding with gold wire lines 3 in the first embodiment. However, solder, gold bump that is ultrasonically bonded between the conductive pattern and the pad electrode, conductive paste such as gold, silver, palladium and rhodium, anisotropic conductive paste, gold wire, and so on can be also used. In addition, the lead peripheral regions 102 are coupled to the outer lead regions 104. The outer lead regions 104 can be connected to external terminals (not shown) through bumps and so on. Thus, the light emitting elements 10 are electrically connected to the external terminals through the lead arrangement 100. Additionally, a groove M is provided on the lead middle region 101 of the lead arrangement 100 between a location where the wire line such as gold wire line for the protection element 5 is bonded and a location where the light emitting elements 10 are mounted. Thus, the die-bonding material for mounting the light emitting elements 10, or the like, can be prevented form reaching the bonding part for the protection element 5. That is, even if the die-bonding material such as epoxy resin is diffused, it flows into and is guided along the groove M. Thus, this diffusion is limited. As a result, it is possible to ensure separation between the location where the wire line for the protection element 5 is bonded and the location where the light emitting elements 10 are mounted. Consequently, it is possible to prevent poor contact of wire line due to interference of the die-bonding material that prevents electrical connection, or the like. Note that, although the protection element 5 is mounted on the right-side lead peripheral region 102 in the example of Fig. (a), the protection element 5 is not limited to this arrangement. The protection element 5 may be mounted on the lead middle region 101 and connected to the lead peripheral region 102 through a wire line by wire-bonding. In this case, the groove M that is located between the light emitting element 10 and the protection element 5 can also prevent poor mount of the protection element 5 caused by the die-bonding material. The groove M can have arbitrary cross-sectional shape and depth. In the case of the first embodiment, the groove M has a straight shape as shown in FIG. 4 for example. In addition, the groove M has a V-shape in a cross-sectional view. In this case, the groove M can be easily formed. Additionally, the groove M is formed not necessarily to penetrate the lead arrangement 100, but enough to be shallowly recessed. In the case where the groove M is shallowly recessed, in molding of the package resin 2, resin can be less prone to flow into this part. Therefore, it is possible to reduce fraction defective. Additionally, the groove M is formed so that its ends are spaced away from an exposed periphery of the lead arrangement 100, as shown in FIGS. 4 and 5, for example. In other words, the ends of the groove M do not reach the exposed periphery of the terminal. In the case of FIG. 5, the groove M is spaced away from the edge that separates the lead middle region 101 from the right-side lead peripheral region 102 and a part that opens beside the left side of the groove M in the lead middle region 101 so that the groove M does not communicate them. Accordingly, it is possible to avoid defectiveness caused by flowing of the package resin 2 into the groove M. In other words, if the groove M reaches and communicates with the edge of the terminal, a wide opening is formed in this part. In this case, resin tends to enter the groove M through the communication part in the terminal edge in injection molding, as a result, this resin that enters the groove M forms flash after molding of the resin and causes defectiveness. In the first embodiment, since the groove M is formed so that its ends are spaced away from the periphery of the terminal as shown in FIG. 7 for example, it is possible to prevent such defectiveness and additionally to effectively prevent short circuit and so on.

Protection Element

The protection element 5 is mounted on an exposed part of the lead peripheral region 102 in the space of the package 2 as shown in FIGS. 7(a) and 7(b). A Zener diode that becomes in a conductive state when a specified voltage or more is applied, a capacitor that absorbs a pulse voltage, and so on, can be used as the protective element 5. The Zener diode has a p-type semiconductor region with a positive electrode, and an n-type semiconductor region with a negative electrode, and is electrically connected to the p-side and n-side electrodes of the light emitting elements 10 in reverse parallel relative to them. The negative and positive electrodes provided in the Zener diode are connected to external terminals through the lead arrangement 100. Thus, when the overvoltage is applied between the terminals, even if the voltage exceeds the Zener voltage of the Zener diode, the voltage between the positive and negative electrodes of the light emitting element 10 is held at the Zener voltage. Accordingly, the voltage does not exceed this Zener voltage. As a result, application of overvoltage to the light emitting element 10 can be prevented. Therefore, it is possible to protect the light emitting elements 10 from overvoltage, and to prevent damage to the elements and the deterioration of their performance. In addition, since all the light emitting elements 10 in the first embodiment are connected to the same lead peripheral region 102, they are connected in a parallel arrangement. The protection element 5 is connected to this lead peripheral region 102. Accordingly, only one protection element is provided. As a result, a parts count is reduced, therefore, it is possible to save time and effort, and to reduce cost.

Sealing Resin 4

Figure 8:
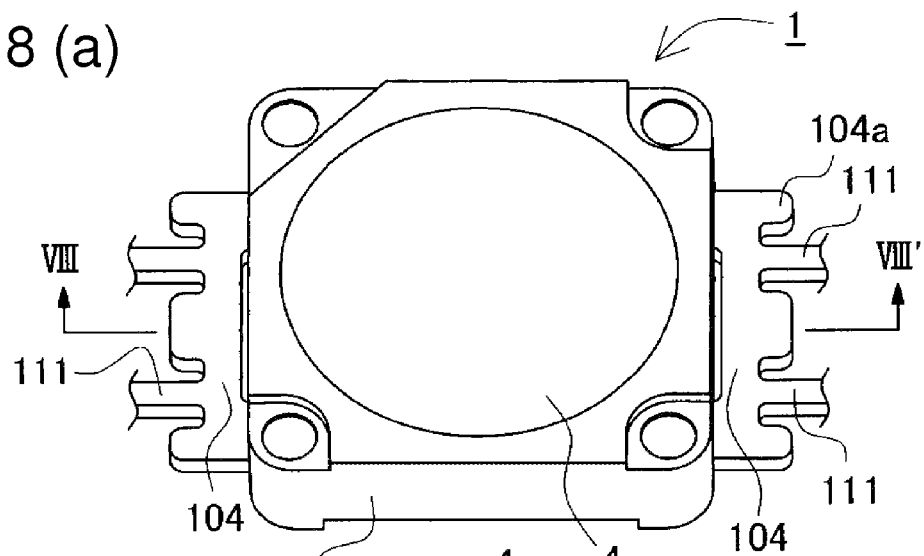
FIG. 8(a) is a perspective view showing one process in the production method of the semiconductor light emitting device according to the first embodiment.
FIG. 8(b) is a cross-sectional view showing the process shown in FIG. 6(a) taken along the line VIII-VIII'.
FIG. 8(c) is a plan view of another process.
Figure 8:
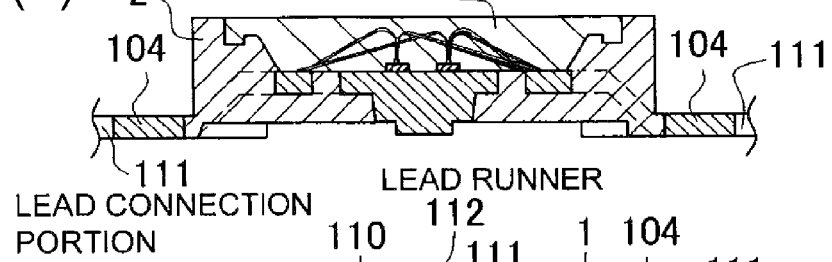
Figure 8:
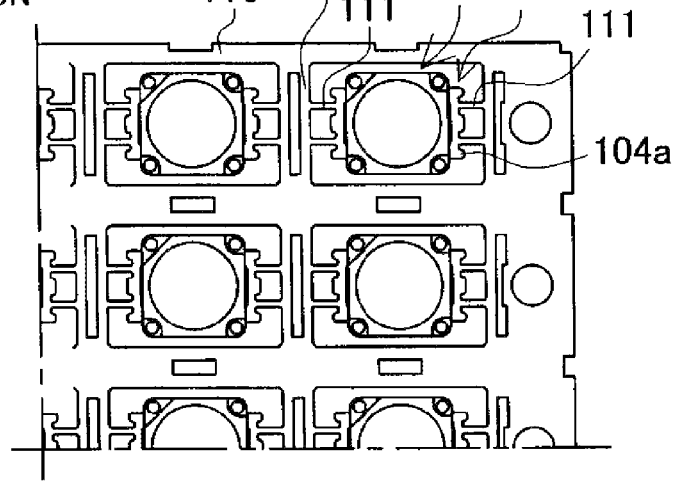

FIG. 8(a) is a perspective view showing a production process of the semiconductor light emitting device 1 in the state where the space of the package 2 that opens upward is filled with a molding material. FIG. 8(b) is a cross-sectional view of the semiconductor light emitting device 1 of FIG. 8(a) taken along the line VIII-VIII'. FIG. 8(c) shows a part of the lead frame 110 that connects a plurality patterns of the lead arrangement 100 in the state of FIGS. 8(a) and 8(b) with the lead connection portions 111.

The light emitting elements 10 and the protection element 5 are secured in proper positions on the lead arrangement 100 in the opening of the package 2, and are electrically connected. Subsequently, the opening space of the package 2 is filled with the sealing resin 4 as the molding member. Thus, it is possible to prevent short circuit of the wire lines 3, and the p-pad and n-pad electrodes of the light emitting elements 10. Thermosetting resin can be used for the sealing resin 4. The opening of the package 2 is filled with the sealing resin 4 by potting. Thus, the opening is sealed. In addition, the opening can be sealed by injection molding with thermoplastic resin, or by transfer molding with thermosetting resin.

A material of the sealing resin 4 is not limited if it is transparent. A silicone resin composition, a denatured silicone resin composition or the like is preferably used. However, a transparent, insulating resin composition such as epoxy resin composition, denatured epoxy resin composition and acrylic resin composition or the like may be used. A silicone resin, an epoxy resin, a urea resin, a fluorocarbon resin, a hybrid resin containing at least one resin selected from the group consisting of them, and so on can be used as sealing resin 4 with weather resistance. In addition, the sealing resin is not limited to an organic material. A high light resistant inorganic material such as glass and silica gel can be used. Additionally, the sealing resin 4 can be formed in a desired shape on the light emission side to provide a lens effect. In this case, light from the light emitting chips can be focused. In the case where a photoreceptor is used as a semiconductor element, the sealing resin 4 through which light passes is formed so that the light is focused toward the photoreceptor and thus is incident on the photoreceptor. In this case, it is possible to improve sensitivity of photoreceptor device. Specifically, the sealing resin 4 can have a convex lens shape, a concave lens shape, an ellipse shape as viewed from the light observation surface side, or a combination shape of two or more types of them. In the first embodiment, a silicone resin is employed as the molding member.

In addition, the sealing resin 4 preferably has adhesiveness. In the case where the sealing resin 4 has adhesiveness, it is possible to improve adhesion between the light emitting element 10 and the lead middle region 101. The resin that has adhesiveness includes not only a material that provides adhesiveness at room temperature, but also a material that provides adhesiveness when predetermined heat and pressure are applied to the sealing resin 4. Additionally, in order to improve adhesive strength of the sealing resin 4, in addition to applying of heat or pressure, it can be dried.

Wavelength Conversion Layer

In the case the sealing resin 4 is mixed with a wavelength conversion member such as phosphor material that is excited by light from the light emitting elements 10 and emits luminescent radiation, the light from the light emitting elements 10 is converted to light with different wavelength, thus, it is possible to emit mixture light of the light from the light emitting elements 10 and the light with wavelength converted by the wavelength conversion member. A phosphor can be suitably used as the wavelength conversion member.

It is preferable that a phosphor material that is mixed as necessary is mixed uniformly at a substantially constant ratio in the sealing resin 4. On the other hand, a phosphor material can be unevenly mixed so as to partially exist. For example, a phosphor material is distributed so that much of the phosphor material is included on the exterior surface side of the sealing resin 4. In this case, much of the phosphor material is spaced away from a contact surface between the light emitting element 10 and the sealing resin 4, thus, heat generated by the light emitting element 10 is less prone to conducted to the phosphor material. Therefore, it is possible to suppress deterioration of the phosphor material.

Zinc cadmium sulfide activated by copper, and a YAG group phosphor activated by cerium can be given as typical phosphors. Particularly, in use under high luminance conditions and for a long time, it is preferable that $(Re_{1-x}Sm_x)_3(Al_{1-y}Ga_y)_5O_{12}$:Ce (where, $0 \leq x \leq 1$, $0 \leq y \leq 1$, and Re is at least one element selected from the group consisting of Y, Gd, La, and Lu), or the like, is employed.

In the light emitting apparatus according to this embodiment of the present invention, as for the phosphor, two or more kinds of phosphors may be mixed. That is, the wavelength components of RGB can be increased by mixing two or more kinds of phosphors of $(Re_{1-x}Sm_x)_3(Al_{1-y}Ga_y)_5O_{12}$:Ce with different contents of Al, Ga, Y, La, Lu, Gd, and Sm. In addition, the reddish component can be increased by using a nitride phosphor with yellow to red light emission, thus, it is possible to provide lighting with high general color rendering index Ra, or an LED with electric bulb color. Specifically, adjusting the amount of phosphor with a different chromaticity point on the chromaticity diagram of CIE depending on the light-emission wavelength of light emitting element can provide light emission of arbitrary point on the chromaticity diagram on the line connected between the phosphor and the light emitting element.

As for the thus-formed phosphor, a luminescent layer consisting of one layer on the surface of light emitting element may includes two or more kinds of the phosphors. Optionally, in the case where a luminescent layer consists of two layers, each layer can include one or two kinds of phosphors. In this case, it is preferable that the phosphors are uniformly distributed in the respective layers in the sealing resin 4. Thus, the wavelength conversion layer can uniformly convert irrespective of portions thereof. Therefore, it is possible to the provide uniform mixture light without unevenness.

Diffusion Agent etc.

A proper material such as viscosity adjusting agent, light diffusion agent, pigment, and phosphor material can be added to the sealing resin 4 depending on applications. Barium titanate, titanium oxide, aluminum oxide, silicon oxide, silicon dioxide, heavy calcium carbonate, light calcium carbonate, a mixture containing at least one kind of them, and so on can be given as light diffusion agent. In this case, it is possible to provide a light emitting apparatus with excellent characteristics of directivity. Similarly, various types of coloring agents can be added as filter material that provides a filter effect that cuts off external incident light and light from the light emitting elements with unnecessary wavelength.

In this specification, the diffusion agent refers to a material that has a center particle size not less than 1 nm to less than 5 µm. The diffusion agent of not less than 1 nm to less than 5 µm excellently scatters light from the light emitting elements 10 and phosphor material, and thus suppresses color unevenness that tends to appear in the case where a phosphor material with a large particle size is used. For this reason, this type of diffusion agent is suitably used. In addition, the spectral half-value width in light emission can be narrow. Therefore, it is possible to a light emitting device with high color purity. A diffusion agent of not less than 1 nm to less than 1 µm has a small interference effect on the wavelength of light from the light emitting elements 10, but has high transparency, and additionally can increase viscosity of resin without reduction of luminous intensity.

Filler

Furthermore, a filler can be added to the sealing resin 4 in addition to a phosphor material. Specifically, materials similar to the diffusion agent can be used as a material of the filler. But, the filler has a center particle size different from the diffusion agent. In this specification, the filler preferably has a center particle size of not less than 5 µm to not more than 100 µm. In the case where the sealing resin 4 contains this type of filler, chromaticity unevenness of the light emitting device can be improved by light dispersion, and additionally thermal shock resistance of the sealing resin 4 can be improved. Accordingly, it is possible to provide a highly reliable light emitting device that can prevent disconnection of wire lines that connect light emitting elements and external terminals, detachment of the bottom surfaces of the light emitting elements from the bottom surface of the recessed portion of the package, and so on, even in use under high temperature. Additionally, the resin can be adjusted so as to have constant flowability for a long time. As a result, the sealing resin can be formed in a desired location. Therefore it is possible to mass-produce the light emitting devices at high yield.

Thickness

Alternatively, the sealing resin may not fill the whole opening of the package 2, but a thin phosphor-containing-resin layer (not shown) may be formed so as to cover only the periphery of the light emitting element 10. In this case, the thickness of the resin layer on the upper and side surfaces of the light emitting element 10 should be substantially uniform. In the case where the thickness of the resin layer on the upper and side surfaces is uniform, it is possible to provide excellent directivity characteristics. In addition, in the case where the thickness of the resin layer on the upper and side surfaces is substantially uniform, it is possible to provide high quality light emission in which light chromaticity distribution unevenness is reduced. Additionally, since the phosphor-containing-resin layer is thin, the density of a phosphor material is increased, and distribution unevenness due to sedimentation of a phosphor material can be reduced. Therefore, it is possible to provide an effect that more uniformly emits light. The thickness of the sealing resin 4 is determined depending on space between opening region that opens in the package 2 and the light emitting element 10. It is preferable that the thickness is 10 to 50 µm, more preferably 20 to 40 µm, and most preferably about 30 µm.

Cut Process for Lead Connection Portion

As shown in FIGS. 8(a) and 8(b), in the semiconductor light emitting device 1 in the state where the space of the package 2 is filled with the sealing resin 4, the outer lead regions 104 are located external of the frame body of the package 2. In addition, the outer lead regions 104 extend in substantially coplanar with the bottom surface of the package 2. The ends of the outer lead regions 104 have substantially rectangular projections and depressions as viewed from the top surface side. The outer lead projections 104a correspond to projections. Additionally, the lead connection portions 111 are interposed between a plurality of the outer lead projections 104a.

FIG. 8(c) shows a part of the lead frame 110 in which a plurality of semiconductor light emitting devices 1 in the state where it is filled with the sealing resin 4 are arranged in a matrix shape in a production process of the semiconductor light emitting device 1. That is, FIGS. 8(a) and 8(b) correspond to enlarged, partial views of FIG. 8(c). As shown in FIG. 8(c), semiconductor light emitting devices 1 are connected to adjacent lead runners 112 through the lead connection portions 111 that extend from the side surfaces of the outer lead regions 104. A lead connection portion 111 can be disposed at one location, alternatively lead connection portions 111 can be disposed at two or more locations on the side surface of the outer lead region 104. Irrespective of their locations they are disposed between the outer lead projections 104a.

Figure 9:
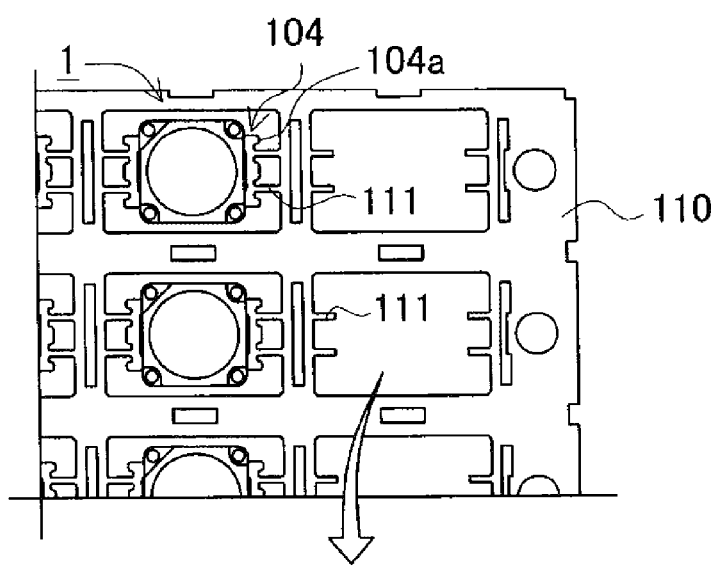
FIG. 9(a) is an enlarged principal part plan view showing one process in the production method of the semiconductor light emitting device according to the first embodiment.
FIG. 9(b) is a perspective view showing another process.
Figure 9:
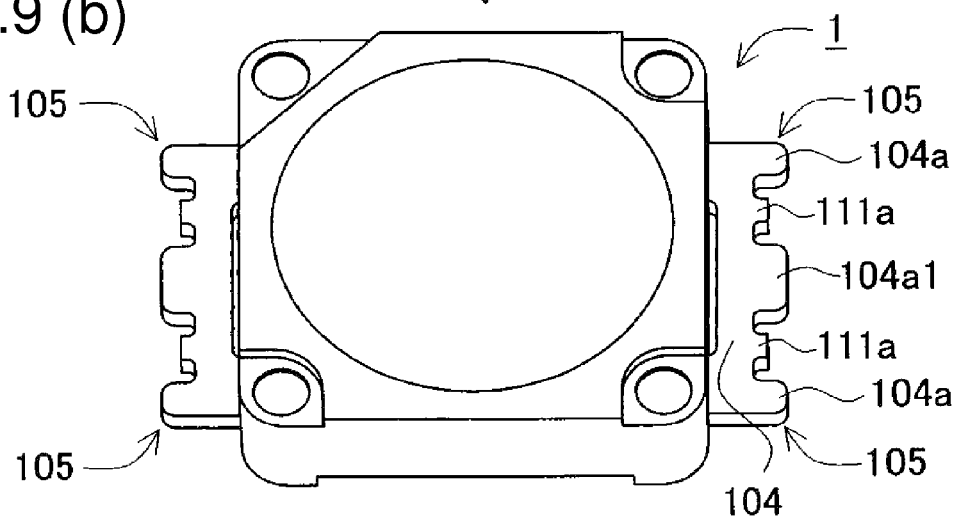

The lead connection portions 111 in the state shown in FIG. 8(c) are cut for separation into individual semiconductor light emitting devices 1. FIG. 9(a) shows the lead frame 110 with lead connection portions partially remaining therein after the semiconductor light emitting devices 1 are cut off from the lead frame 111. FIG. 9(b) shows one semiconductor light emitting device that is cut off as a chip. As shown in FIG. 9(b), in the outer lead regions 104 of the semiconductor light emitting device 1 of chip, cut-off lead connection portions 111 remain in a projection shape. As a result, the number of projections increases. The projections corresponding to the increased number are referred to as lead terminal smaller projections 111a. The lead terminal smaller projections 111a are projection parts that are formed by parts of the lead connection portions 111 that remain on the outer lead regions 104, after the lead connection portions 111 that connects a plurality of patterns of the lead arrangement 100 are cut off. Thus, the lead terminal smaller portions 111a are interposed between the plurality of the outer lead projections 104a. That is, the lead terminal smaller portions 111a do not form edge-side projections 105 (projections at four corners in FIG. 9(b)) of a plurality of projections that are formed on the end surface part of the outer lead region 104. The outer lead projections 104a forms at least the edge-side projections 105.

As discussed later, cut surfaces of the lead connection portions 111 are not subjected to plating that prevents corrosion of metal. On the other hand, the outer lead projections 104 are subjected to plating that prevents corrosion of metal, and thus has good wettability. Since the edge-side projections 105 in the outer lead regions that are subjected to plating are located at the four corners of the semiconductor light emitting device 1 as shown in FIG. 9(b), even though the cut surfaces of the lead connection portions 111 have poor adhesiveness, this construction can provides an effect of high adhesiveness between the semiconductor light emitting device 1 and a mount body (not shown) with solder or the like.

Figure 10:
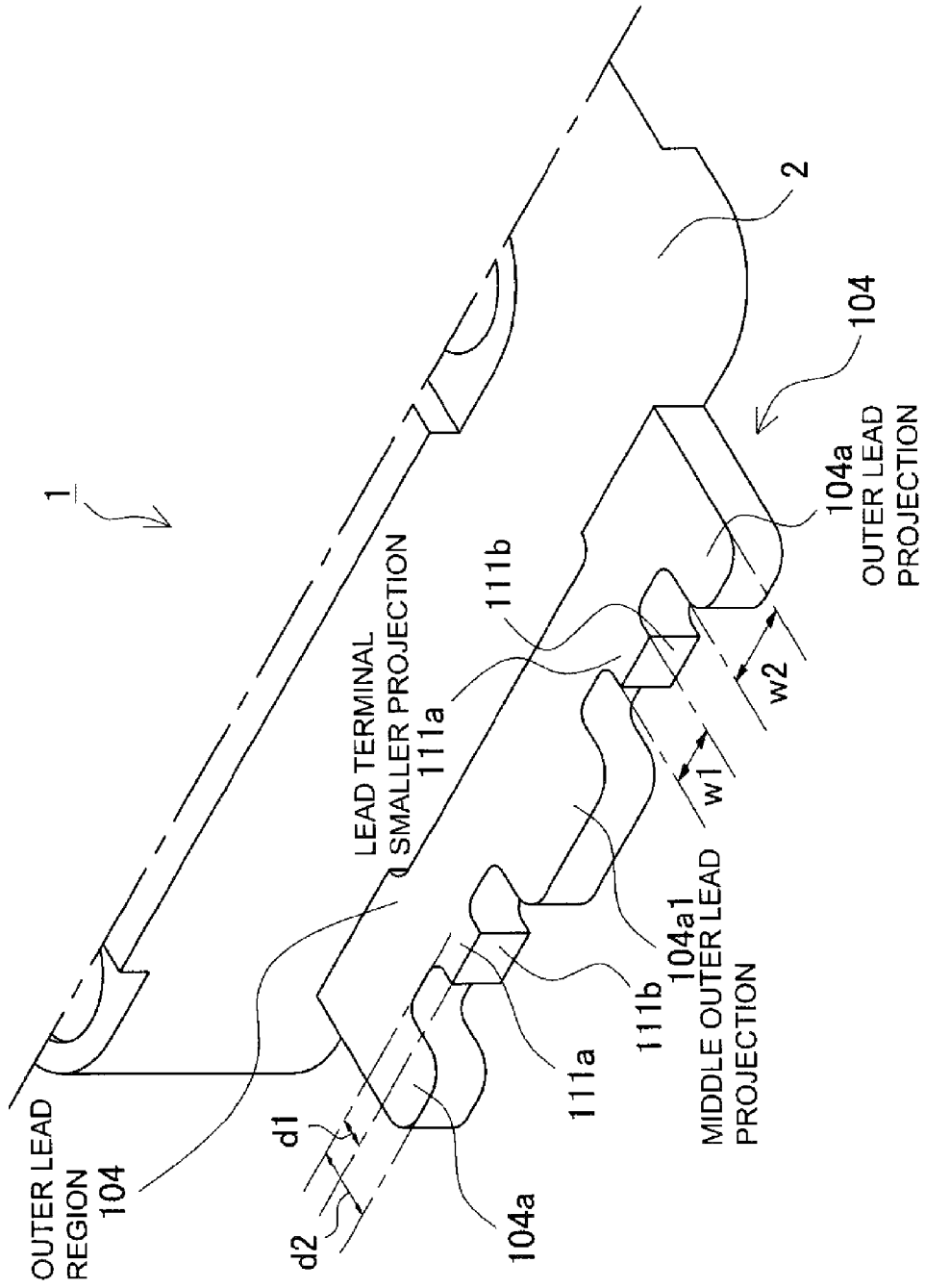
FIG. 10 is an enlarged partial view of the semiconductor light emitting device.

FIG. 10 is an enlarged, perspective view of the outer lead region 104 in the semiconductor light emitting device 1 that is separated by cutting the lead connection portions 111. As shown in FIG. 10, in the outer lead region 104 of the semiconductor light emitting device 1 according to the first embodiment, the lead terminal smaller projections 111a that form the projections on the end surface thereof are interposed between the outer lead projections 104a. In addition, a length d1 from the bottom of the rising edge that forms a rectangular shape to the end surface in the lead terminal smaller projection 111a is shorter than a length d2 from the bottom of the rising edge that forms rectangular shape to the end surface in the outer lead projection 104a (d1<d2). That is, the lead terminal smaller projections 111a are recessed toward the package 2 side relative to the outer lead projections 104a. The plurality of the outer lead projections 104a preferably have the same length d2, but may have different lengths. However, the length of the outer lead projections 104a that interpose the lead terminal smaller projection 111a have a length longer than the length of the lead terminal smaller projection 111a adjacent to them.

In addition, corners that form rectangular parts of the outer lead projections 104a are rounded and have arc shapes. On the other hand, corners that form rectangular parts of the lead terminal smaller projections 111a are not rounded and have a substantially edged right angle. The reason is that the corners are produced by cutting the lead connection portions 111 in a direction perpendicular thereto. Additionally, a width w1 of the lead terminal smaller portion 111a is smaller than a width w2 of the outer lead projection 104a (w1<w2). Thus, the lead terminal smaller projections with smaller width and shorter length are interposed between the plurality of the outer lead projections 104a. This arrangement prevents lead cut surfaces 111b of the lead terminal smaller portions 111a from being exposed outward. This construction can mainly have the following advantages.

1. In the lead cut surfaces 111b, the area of a part where metal is corroded can be reduced, thus, it is possible to avoid poor electrical conduction.
2. It is possible to avoid that the sharp edges of the lead cut surfaces 111b damage other semiconductor light emitting devices 1.
3. A blade that cuts off the lead connection portion 111 can be small.
4. A process that bends a lead terminal can be omitted.
5. In this construction, since the lead terminals do not extend along the side surface of the frame body that composes the semiconductor light emitting device 1, the semiconductor light emitting device 1 can be thin.
6. Since the lead terminals are not required to have a length enough to be bent, the lead arrangement can be small. Accordingly, the plurality of patterns of the lead arrangement can be arranged in one sheet of lead frame to minimize waste. Therefore, it is possible to improve productivity.

The aforementioned advantages will be described in more detail. The outer lead regions 104 compose part of the lead arrangement 100. Accordingly, their surfaces are covered by a protection film to prevent corrosion of metal in a prior process. For example, silver is plated thereon. The plated lead arrangement 100 is less prone to be oxidized by air, and thus is prevented from corrosion of metal. In addition, silver has good wettability, and thus can provide electrical adhesiveness between the lead arrangement 100 and a separate mount body with solder or the like. After silver is plated, the lead connection portions 111 are cut off. As a result, silver is not plated on the lead cut surfaces 111b as cut surfaces of the lead connection portions 111. Accordingly, the lead cut surfaces 111b may be oxidized by air or the like. The lead cut surfaces 111b that are oxidized by air cause rust and poor electrical conduction. In addition, an oxidized part has poor wettability, and thus causes poor electrical or mechanical connection. Additionally, as discussed above, since the cut surfaces are sharp, through production processes of the semiconductor light emitting device 1, the cut surfaces may damage other semiconductor light emitting devices 1 and so on. For this reason, in order to minimize the areas of the cut surfaces and to reduce exposure of them, the width w1 of the lead terminal smaller projections 111a is small, and the lead connection portions 111 are cut off so that the length d1 is short. Consequently, it is possible to avoid concerns about the lead cut surface 111b. Besides, the lead connection portions 111 serves to hold the lead frame 110 adjacent to them in production processes. In addition, the semiconductor light emitting devices 1 are subjected to a process that secures the packages 2, a process that mounts the light emitting elements 10 on the lead arrangement by die-bonding, and a process that fills the sealing resin 4 in the openings of the packages 2 until the lead connection portions 111 are cut off. From these points of view, the length, width and number of the lead connection portions 111 are determined in consideration of mechanical strength that can bear the load applied to the lead arrangement through the production processes and can effectively arrange patterns of the lead arrangement in the frame.

Furthermore, since the width w1 of the lead terminal smaller projection 111a and the area of the cut surface 111b are small, a blade that cuts off the lead connection portion 111 can be small. However, as discussed above, the lead terminal smaller portions 111a are interposed between the plurality of the outer lead projections 104a. In this case, if the interval between the plurality of the outer lead projections 104a is narrow, the blade that cuts off the lead connection portion 111 may come in contact with the outer lead projection 104a. On the other hand, if the interval between the plurality of the outer lead projections 104a is too wide, other semiconductor light emitting devices 1 as chips may be caught between the outer lead projections 104a. In this case, the lead cut surface 111b may cause damage. From this point of view, the intervals among the plurality of the outer lead projections 104a and the lead terminal smaller portions 111a are determined.

Figure 17:
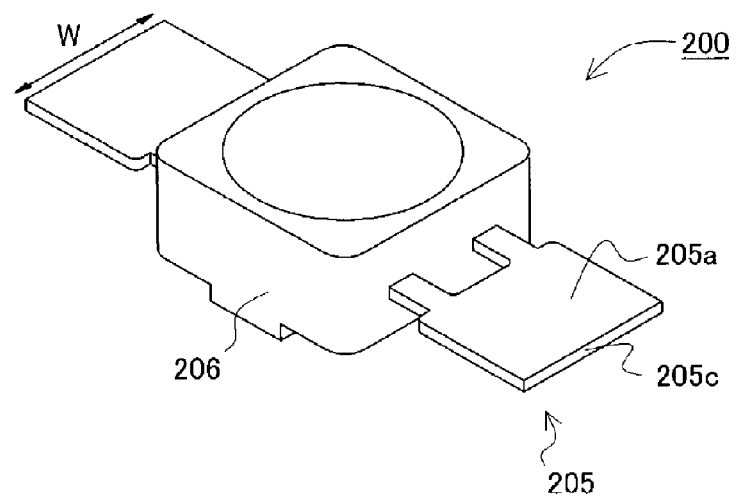
FIG. 17 is a perspective view showing a conventional LED light emitting device in one example.
Figure 18:
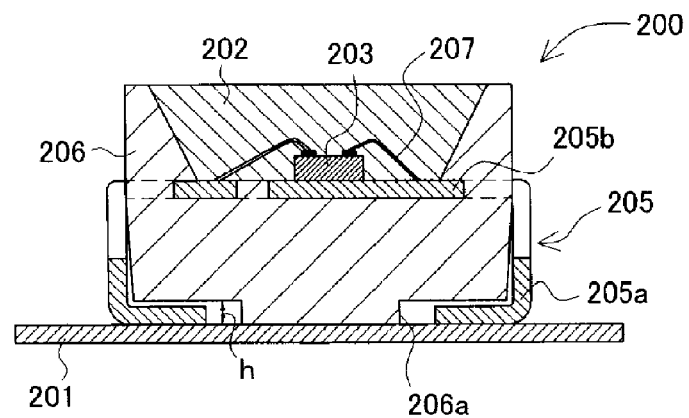
FIG. 18 is a cross-sectional view showing the conventional LED light emitting device in one example.

In a conventional LED light emitting device, the outer lead region 104 or the lead terminal smaller projection 111a is used as a lead terminal. That is, as shown in FIG. 17, a lead terminal 205a is bent so as to extend along the side surface and the bottom surface of a frame body 206 of an LED light emitting device 200. The lead terminal 205a that is bent toward the bottom surface side and a mount body 201 are electrically bonded through solder or the like. Thus, an LED element 203 in the LED light emitting device 200 is electrically connected to external terminals. Accordingly, the lead terminal 205a (that corresponds to the outer lead region 104 or the lead terminal smaller projection 111a in the first embodiment) necessarily has a length that reaches at least the bottom surface of the LED light emitting device 200 through the side surface.

On the contrary to this, in the semiconductor light emitting device 1 according to the first embodiment, the outer lead region 104 is short. Accordingly, dissimilarly to this conventional example, the outer lead region 104 cannot be bent so as to extend along the side surface and the bottom surface of a frame body of the semiconductor light emitting device 1. However, the outer lead regions 104 according to the first embodiment project outward from the sides of the bottom surface of the semiconductor light emitting device 1 in coplanar with the bottom surface of the semiconductor light emitting device 1 as shown in FIG. 2. In other words, the bottom surface of the outer lead region 104 is coplanar with the bottom surface of the frame body of the semiconductor light emitting device 1. In addition, the bottom surface also serves as a terminal. Thus, when the semiconductor light emitting device 1 is installed on the mount body 20, the bottom surface of the outer lead region 104 comes in contact with the mount body 20. The bottom surface of the outer lead region 104 is mechanically and electrically connected to the mount body 20 with silver paste, solder or the like. As a result, the light emitting elements 10 on the lead arrangement are electrically connected to external terminals. That is, the outer lead region 104 serves as a lead terminal in the case of the conventional example. Accordingly, a process that bends the lead connection portions 111 is omitted. Additionally, it is possible to avoid metal stress on the lead connection portions 111 that is produced by bending. If the lead terminal is bent so as to extend along the side surface and to turn a corner toward the bottom of the semiconductor light emitting device, the semiconductor light emitting device 1 becomes tall. The semiconductor light emitting device 1 according to the first embodiment can also avoid this problem. Moreover, since the lead terminals are not required to have a length enough to be bent, the lead arrangement can be compact. Accordingly, the plurality of lead arrangement patterns can be arranged in one sheet of lead frame to minimize waste. Therefore, it is possible to improve productivity.

Figure 19:
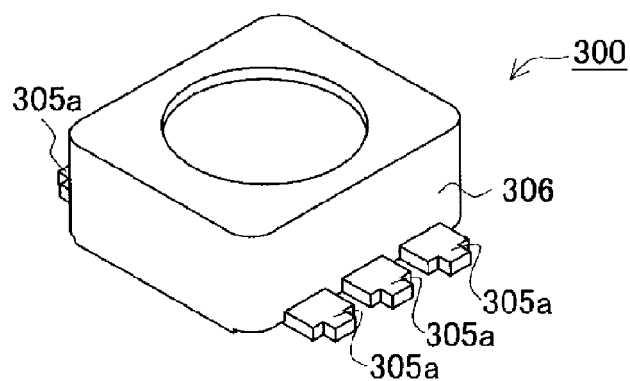
FIG. 19 is a perspective view showing a conventional LED light emitting device in another example.
Figure 20:
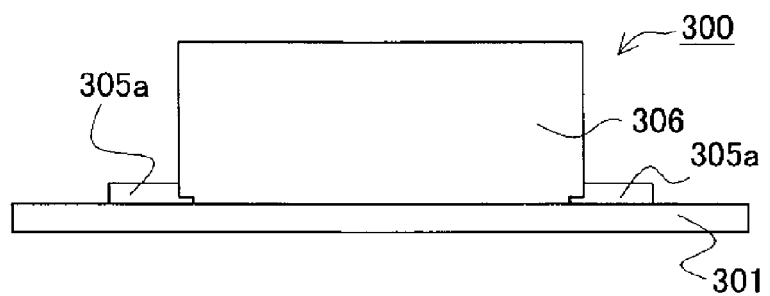
FIG. 20 is a side view showing the conventional LED light emitting device in another example.

In the case where the aforementioned short outer lead region 104 that is not required to be bent is formed, if the area of the lead cut surface 111b is large, metal is easily corroded, thus, conductivity decreases. In addition, a defect due to edged corners of cut surface in the case of FIG. 19 still exists. However, in the semiconductor light emitting device 1 according to the first embodiment, since the lead cut surface 111b is less prone to be exposed, it is possible to avoid the above defect.

Figure 11:
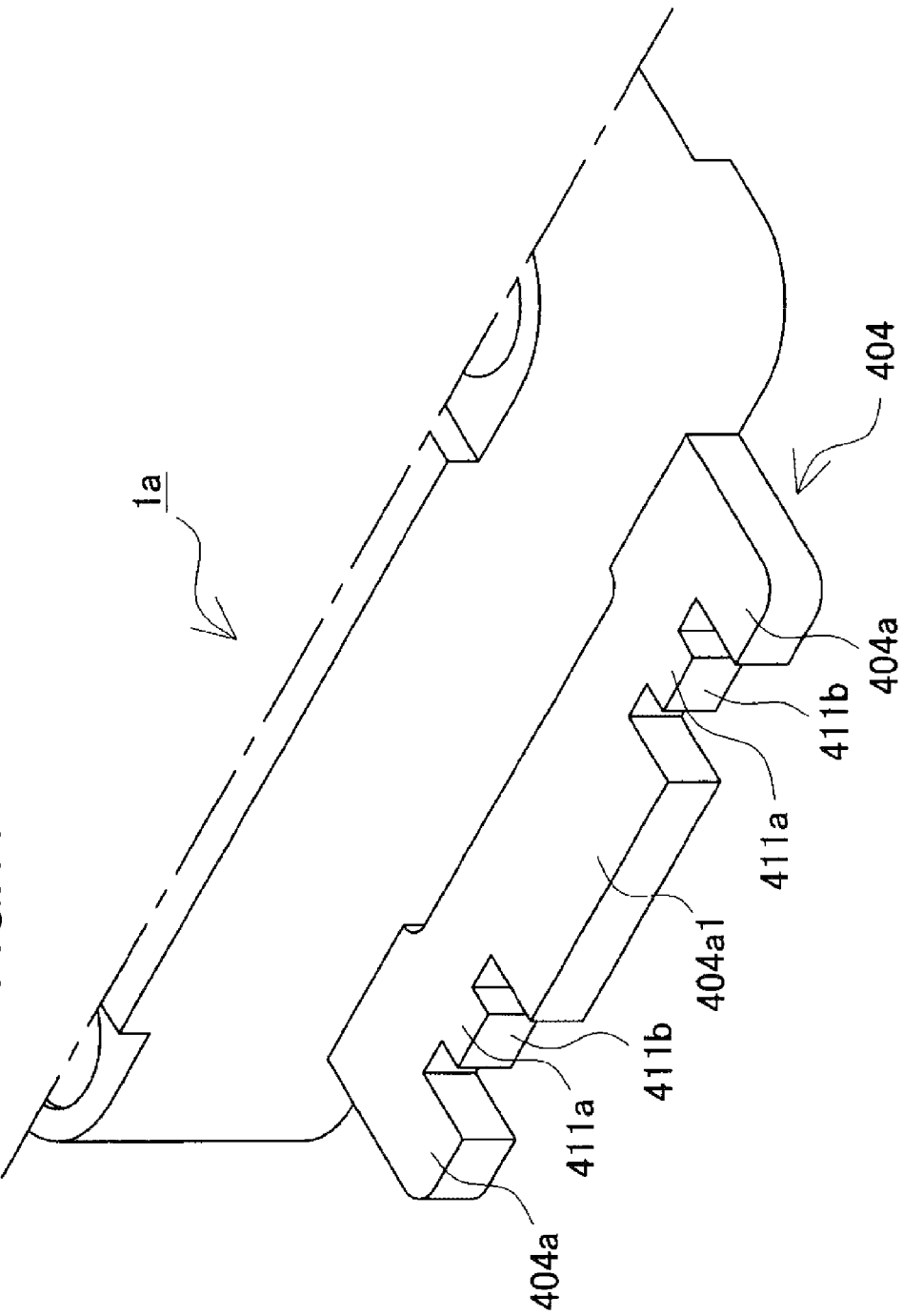
FIG. 11 is an enlarged partial view of the semiconductor light emitting device.

Furthermore, FIG. 11 is an enlarged, perspective view showing an outer read region 404 that has rectangular projections different from the foregoing projections. A semiconductor light emitting device 1a has the same construction and is formed in the same manner as the semiconductor light emitting device 1 except that the outer lead region has a different shape. In edges of the outer lead region 404 of this semiconductor light emitting device 1a, only corners of the outer lead projections 404a on the edge sides are rounded. That is, in a formation process of lead arrangement, only the corners on the edge sides in a plurality of the outer lead projections 404a are required to be rounded. Accordingly, it is possible to save time and effort that round a middle outer lead projection 404a1, and so on. In particular, since the corners on the edge sides of the outer lead projections 404a that are prone to come in contact with other semiconductor light emitting devices are rounded, it is possible to reduce damage to other semiconductor light emitting devices caused by the outer lead projections 404a.

On the other hand, the mount body 20 that is provided with the semiconductor light emitting device 1 is formed of a base mount with predetermined patterns disposed thereon. The base mount is made of an insulating material such as glass epoxy lamination board, liquid crystal polymer board, polyimide resin board and ceramic board. The predetermined patterns are arranged in portions to be connected to the lead arrangement 100. Alternatively, a sub-mount board may be used as mount body 20 to secure the semiconductor light emitting device 1. In this case, the sub-mount board is interposed between the semiconductor light emitting device 1 and another mount body.

Furthermore, as shown in FIG. 2, the bottom surface of the lead middle region 101 is externally exposed, and forms a part of the bottom surface of the semiconductor light emitting device 1. The lead middle region 101 is provided with the light emitting elements 10 mounted thereon. That is, when the semiconductor light emitting device 1 is bonded on the mount body 20, the bottom surface 101a of the lead middle region 101 comes in flat contact with the mount body 20. Accordingly, in the case where an excellent thermal conductive material is used for the mount body 20, heat generated in light emission of the light emitting elements 10 is directly conducted to the mount body 20 through the lead middle region 101, and thus is dissipated external of the semiconductor light emitting device 1. Thus, heat generated by the light emitting elements is prevented from being stored in the semiconductor light emitting device 1. Consequently, it is possible to increase life of the semiconductor light emitting device 1.

Still furthermore, the bottom surface 101a of the lead middle region 101 provides stable adhesiveness between the semiconductor light emitting device 1 and the mount body 20. Thus, the semiconductor light emitting device 1 is prevented from being installed on the mount body 20 at an incline. Therefore, it is possible to avoid deviation of the reach of light.

Second Embodiment

Figure 12:
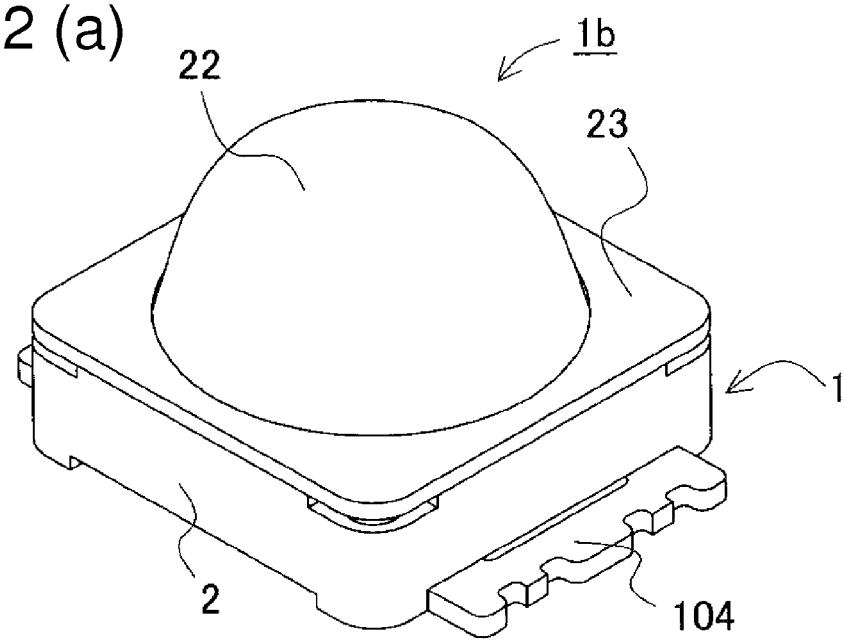
Figure 12:
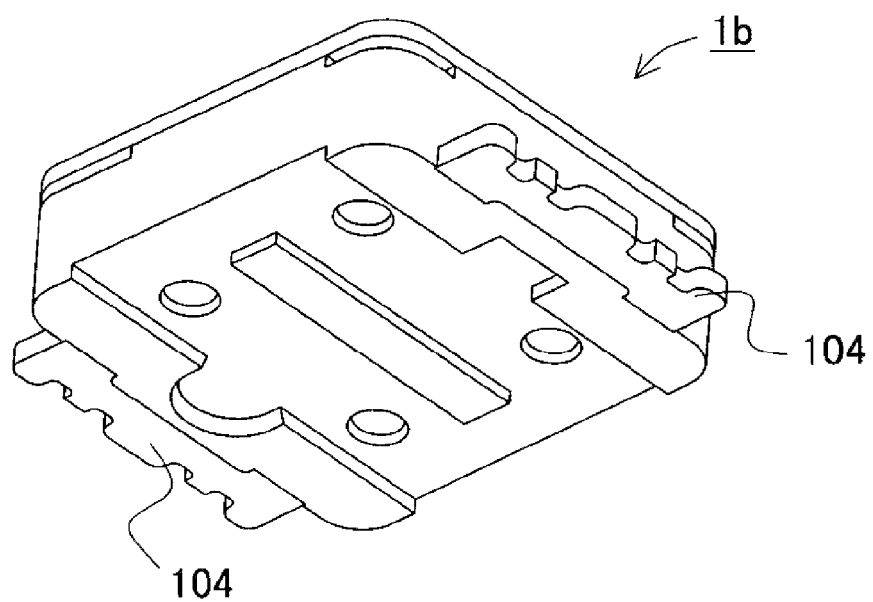

FIG. 12 shows a lens-attached semiconductor light emitting device 1b. FIG. 12(a) is a perspective view showing the lens-attached semiconductor light emitting device 1b as viewed from the top side. FIG. 12(b) is a perspective view showing the lens-attached semiconductor light emitting device 1b as viewed from the bottom side. The lens-attached semiconductor light emitting device 1b is similar to the semiconductor light emitting device 1 or 1a according to the first embodiment except that a dome-shaped lens 22 is additionally attached on the light emission surface side. The dome-shaped lens has a dome shape such as hemisphere. The members same as the semiconductor light emitting device 1 or 1a according to the first embodiment can be used except for this lens.

As shown in FIG. 12(a), the dome-shaped lens 22 according to this second embodiment is attached so as to cover the light emission surface, i.e., an upper middle part of the semiconductor light emitting device 1 in FIG. 12(a). In addition, the bottom of the dome-shaped lens 22 is secured by a lens mount 23. The lens mount 23 has the area substantially same as the top surface of the package 2 of the semiconductor light emitting device 1. The lens mount 23 additionally includes projections at four corners on the contact surface side to be in contact with the semiconductor light emitting device 1. Particularly in the case where the projections of the lens mount 23 have a shape that can be fitted in a recessed portion of the injector pin print 21, it is possible to provide strong connection by using stepped parts of the recessed portions that are formed in the injector pin prints 21. The injector pin prints 21 are produced at four corners of the package resin 2, when the package resin 2 is formed by casting, as shown in FIG. 1. Note that the dome-shaped lens 22 may be formed unitarily with the lens mount 23. In this case, it is possible to reduce the parts count of the lens-attached semiconductor light emitting device 1b.

In the case where the dome-shaped lens 22 is attached to the semiconductor light emitting device 1, the light outgoing efficiency of the semiconductor light emitting device 1 is improved. The reason is that, when light from light source enters the dome-shaped lens 22 that covers the middle part of the semiconductor light emitting device 1, the total internal reflection angle of light can be large.

Third Embodiment

Figure 13:
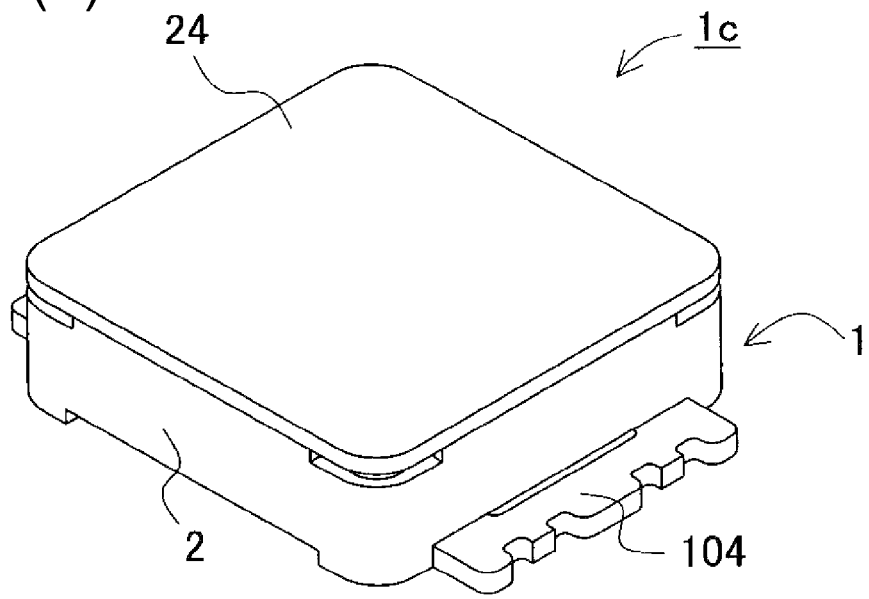
Figure 13:
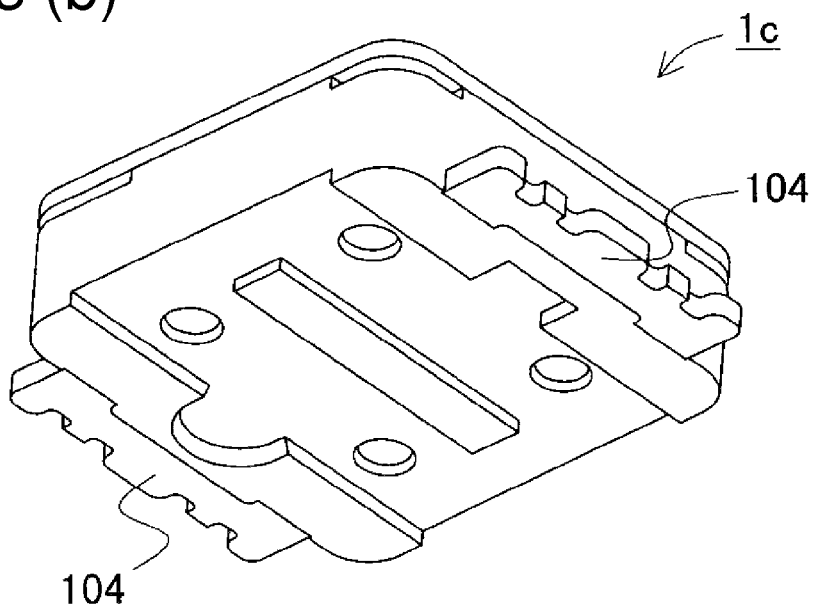

FIG. 13 shows another lens-attached semiconductor light emitting device 1c. FIG. 13(a) is a perspective view showing the lens-attached semiconductor light emitting device 1c as viewed from the top side. FIG. 13(b) is a perspective view showing the lens-attached semiconductor light emitting device 1c as viewed from the bottom side. The semiconductor light emitting device 1c is similar to the semiconductor light emitting device 1 or 1a according to the first embodiment except that a Fresnel lens 24 is additionally attached on the light emission surface side. The Fresnel lens has concentrically narrow circular stepped lens setbacks that are divided from a convex surface of planoconvex lens, and has a small thickness but provides a thicker convex lens function. The members same as the semiconductor light emitting device 1 or 1a according to the first embodiment can be used except for this lens.

Similarly to the second embodiment, the Fresnel lens 24 includes projections at four corners on the contact surface side to be in contact with the semiconductor light emitting device 1. The projections can be fitted into the recessed portions of the package resin 2. In the lens-attached semiconductor light emitting device 1c that is provided with the Fresnel lens 24 attached thereto, the light source is arranged at a focus distance of the Fresnel lens 24. Light emitted from the light source passes through the Fresnel lens 24 and outgoes as parallel light. That is, light emitted from the point-source light is finely converted into parallel light. Thus, a point light source can effectively emits light frontward. Consequently, it is possible to improve light outgoing efficiency of the semiconductor light emitting device 1.

As discussed in the second and third embodiments, it is possible to easily attach the lens and lens mount on an upper part of the semiconductor light emitting device 1 or 1a by using the injector pin prints 21 of the package resin 2. A lens that is attached to the semiconductor light emitting device 1 or 1a is not limited to a Fresnel lens and a dome-shape lens. Various types of lenses can be used. In addition, since each of the lens-attached semiconductor light emitting devices 1b and 1c according to the second and third embodiments includes the outer lead region 104 same as the semiconductor light emitting device 1 or 1a according to the first embodiment, needless to say, each of them has advantages discussed above such as an advantage that can reduce a corrosion area of metal.

Fourth Embodiment

Figure 14:
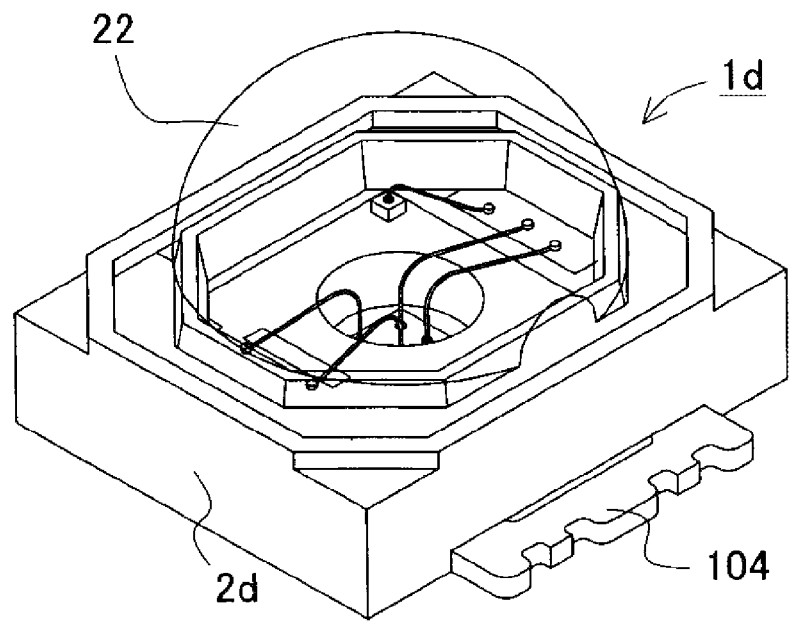
Figure 14:
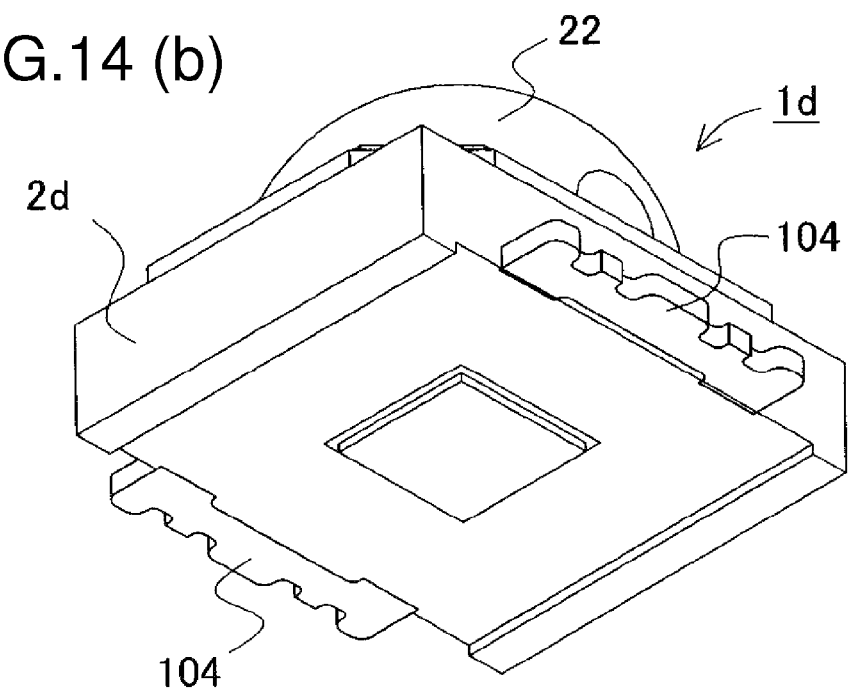

FIG. 14 shows another lens-attached semiconductor light emitting device 1d. FIG. 14(a) is a perspective view showing the lens-attached semiconductor light emitting device 1d as viewed from the top side. FIG. 14(b) is a perspective view showing the lens-attached semiconductor light emitting device 1d as viewed from the bottom side. The semiconductor light emitting device 1d includes a package resin 2d different from that of the first embodiment. The package resin 2d has an opening with a circular periphery. The opening has a recessed shape as viewed in a cross-sectional shape and is disposed in an octagonal frame. Light emitting elements are disposed on the bottom of the opening. In addition, the package resin 2d has a substantially rectangular parallelepiped shape that has a pair of opposed shorter sides and a pair of opposed longer sides. Outer lead regions 104 project outward of the pair of longer sides in the package resin 2d. The outer lead regions 104 have a shape similar to the outer lead regions 104 in the first embodiment. Accordingly, as discussed above, the lens-attached semiconductor light emitting device 1d has the advantages that are provided by using the outer lead regions with this shape.

Fifth Embodiment

Figure 15:
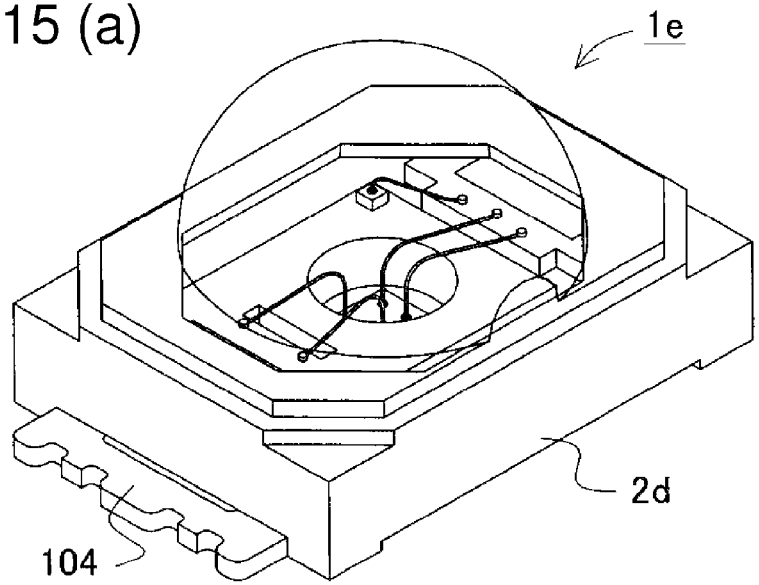
Figure 15:
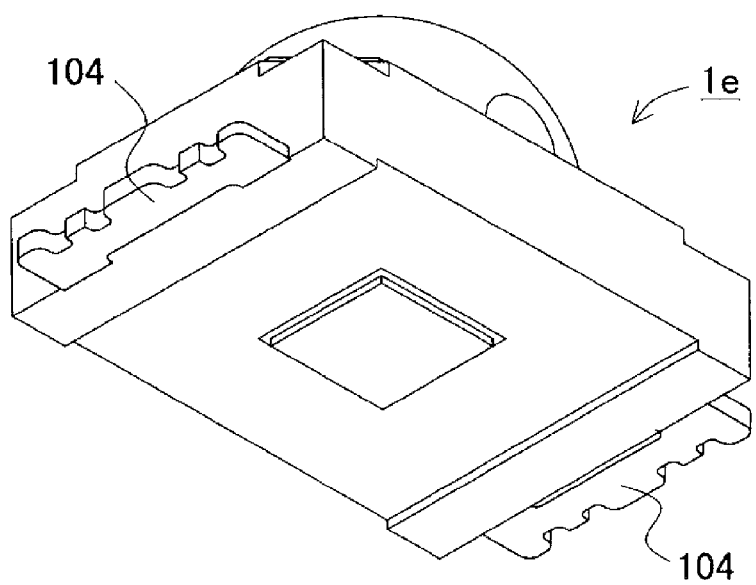

FIG. 15 shows another lens-attached semiconductor light emitting device 1e. FIG. 15(a) is a perspective view showing the lens-attached semiconductor light emitting device 1e as viewed from the top side. FIG. 15(b) is a perspective view showing the lens-attached semiconductor light emitting device 1e as viewed from the bottom side. The lens-attached semiconductor light emitting device 1e includes a semiconductor light emitting device and a package resin 2d similar to the fourth embodiment. Outer lead regions 104 in this fifth embodiment project outward of a pair of shorter sides in the package resin 2d. The outer lead regions 104 have a shape similar to the outer lead regions 104 in the first embodiment. Accordingly, the lens-attached semiconductor light emitting device 1d has the aforementioned advantages that are provided by using the outer lead regions with this shape. In other words, the shape of the package resin 2 that is secured to a lead arrangement is not limited, and various types of shapes can be used, if the outer lead regions 104 that project from side surfaces of the package resin 2 have a shape shown in the description in the first embodiment.

Sixth Embodiment

Figure 16:
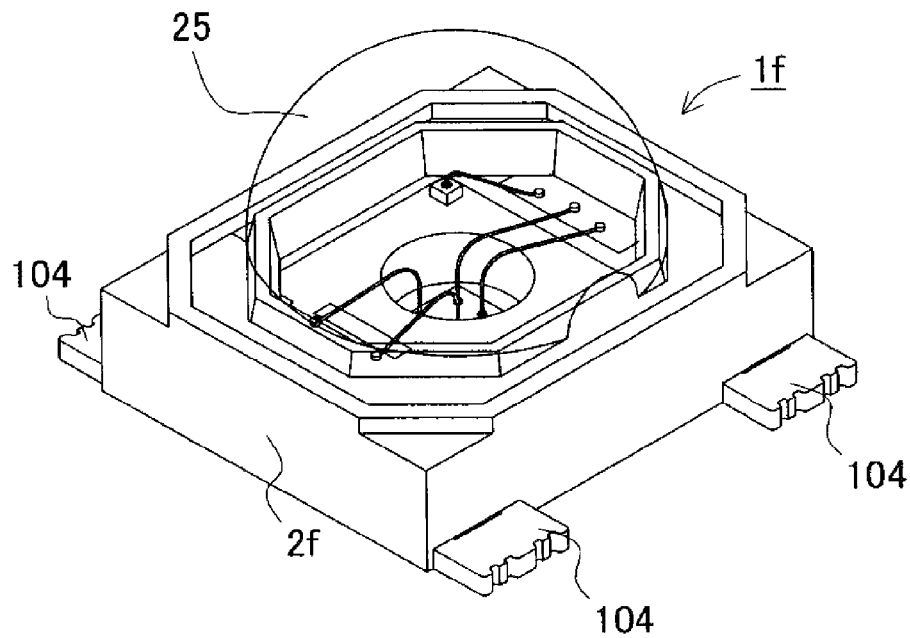
Figure 16:
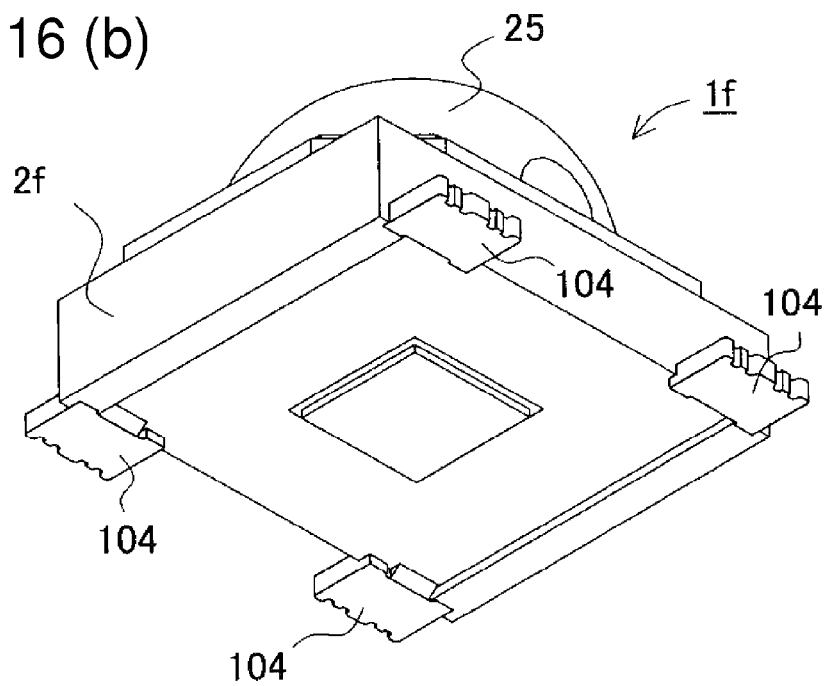

Moreover, FIG. 16 shows still another LED light emitting device 1f. FIG. 16(a) is a perspective view showing the semiconductor light emitting device 1f as viewed from the top side. FIG. 16(b) is a perspective view showing the semiconductor light emitting device 1f as viewed from the bottom side. The semiconductor light emitting device 1f has a lens 25 that is attached on the top side of light emission surface. A dome-shaped lens, a Fresnel lens discussed in the foregoing embodiments, or various types of lenses other than them can be used as the lens 25. Note that lens 25 can be omitted, and only semiconductor light emitting device can be used. In addition, in a rectangular-shaped package resin 2f that composes the semiconductor light emitting device 1f, the shape of opening is not limited to a substantially octagonal illustrated above. Various types of shapes such as quadrangle and circle can be used.

As shown in FIGS. 16(a) and 16(b), two outer lead regions 104 in the semiconductor light emitting device 1f according to this sixth embodiment are spaced away from each other on each of arbitrary opposed surfaces of the package resin 2f. The outer lead regions 104 project from parts in proximity to lower end of each of the opposed surfaces. The surfaces that are provided with the outer lead regions 104 are limited to neither longer nor shorter sides that define the rectangular shape of the package resin 2f. In the semiconductor light emitting device 1f according to this sixth embodiment, two outer lead regions 104 project from the bottom sides of the opposed surfaces that define longer sides of the package resin 2f, and are located in proximity to the corners. This arrangement can provide stable adhesiveness between the semiconductor light emitting device and a mount body on which the semiconductor light emitting device is installed. Note that the number of the outer lead regions 104 that are disposed on each surface is not limited to two, but can be three or more. In this case, the outer lead regions are preferably spaced away from each other at a substantially constant interval. The shape of the outer lead regions 104 is similar to that in the first embodiment. This shape provides the aforementioned advantages.

A light emitting device according to the present invention and a method for producing it can be applied to a light source for lighting, an LED display, a back light source, a signal light, an illuminated switch, various sensors, and various indicators, and so on.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims.

What is claimed is:

1. A light emitting device comprising:
    a semiconductor light emitting element having an electrode;
    a lead including a first lead and a second lead, the first lead having a top surface which the light emitting element is mounted thereon and a bottom surface opposed to the top surface, the second lead having a lead peripheral region where a wire connected to the electrode of the light emitting element is bonded therewith;
    a package forming a recessed opening so as the top surface of the lead to be partially exposed in the bottom of the opening; and
    a sealing resin that seals the opening of the package,
    wherein the first lead comprises a lead middle region where the semiconductor light emitting element is mounted thereon to thermally conduct therewith, and a bottom surface of the lead middle region is exposed from the package,
    wherein the second lead has an outer lead region that is projected outwardly from the both side surfaces of the package at a bottom of the package,
    wherein the bottom surface of the first lead middle region is substantially coplanar with a bottom surface of the outer lead region, and
    wherein the second lead has a lead bent region that is positioned between the lead peripheral region and the outer lead region, the lead bent region being downwardly inclined at an oblique angle toward the outer lead region from the lead peripheral region and being embedded inside the package.

2. The light emitting device according to claim 1, wherein ends of the outer lead regions form substantially rectangular projections and recesses as viewed from the upper surface.

3. The light emitting device according to claim 1, wherein the bottom surface of the lead middle region is positioned lower than a bottom surface of the package.

* * * * *